US005838949A

United States Patent [19]
Hassoun

[11] Patent Number: 5,838,949
[45] Date of Patent: Nov. 17, 1998

[54] SYSTEM AND METHOD FOR EXECUTION-SEQUENCED PROCESSING OF ELECTRONIC DESIGN SIMULATION RESULTS

[75] Inventor: Jean André Hassoun, Cupertino, Calif.

[73] Assignee: Design Acceleration Inc., San Jose, Calif.

[21] Appl. No.: 579,696

[22] Filed: Dec. 28, 1995

[51] Int. Cl.$^6$ .................................................. G06F 9/455
[52] U.S. Cl. .................... 395/500; 395/183.09; 364/578; 364/488
[58] Field of Search .............................. 395/500, 183.09; 364/578, 488, 489, 490, 491; 371/16.3, 20.1

[56] References Cited

U.S. PATENT DOCUMENTS

| | | | |
|---|---|---|---|
| 4,456,994 | 6/1984 | Segarra ...................................... | 371/16 |
| 4,706,581 | 11/1987 | Parkinson ................................. | 110/349 |
| 5,276,854 | 1/1994 | Court et al. ............................... | 395/500 |
| 5,329,471 | 7/1994 | Swoboda et al. ........................ | 364/578 |
| 5,546,562 | 8/1996 | Patel ......................................... | 395/500 |
| 5,588,142 | 12/1996 | Sharrit ...................................... | 395/500 |
| 5,621,651 | 4/1997 | Swoboda ................................. | 364/489 |
| 5,621,670 | 4/1997 | Maeda et al. ............................ | 364/578 |

OTHER PUBLICATIONS

Hassoun, J. and Pollock, S., "The Introduction of a new time dimension for verilog design analysis" from Electronic Engineering, Jan. 1995.

*Primary Examiner*—Kevin J. Teska
*Assistant Examiner*—Tyrone V. Walker
*Attorney, Agent, or Firm*—Carr & Ferrell LLP

[57] ABSTRACT

A simulator interface unit receives simulation results associated with a particular set of result identifiers and generated by an electronic design simulator. For each such result identifier, a history file manager stores a simulation result corresponding to a simulation-time value change. The history file manager additionally stores each simulation result generated beyond a first result activity during the execution of simulation code associated with each simulation-time value. The history file manager maintains an internal-time value that indicates when each stored simulation result was generated during the execution of simulation code, relative to the generation of each other stored simulation result. The history file manager generates a time translation table that associates unique simulation-time values with internal-time values. A results data server, in conjunction with viewing and interface tools, selectively present simulation results in a simulation-time format or a sequence-time format. In the simulation-time format, final simulation results generated at each simulation-time value are shown, and a set of simulation-time markers is shown. Each simulation-time marker indicates whether multiple assignments were made to a given variable during the execution of simulation code associated with a particular simulation-time value. In the sequence-time format, initial simulation results generated for a given simulation-time value as well as each variable change that occurred during the execution of simulation code associated with this simulation-time value are shown.

29 Claims, 20 Drawing Sheets

| | | |
|---|---|---|
| SIMULATION-TIME VALUE | RESULT IDENTIFIER | RESULT VALUE |
| | RESULT IDENTIFIER | RESULT VALUE |
| | RESULT IDENTIFIER | RESULT VALUE |
| | ⋮ | |
| | RESULT IDENTIFIER | RESULT VALUE |
| SIMULATION-TIME VALUE | RESULT IDENTIFIER | RESULT VALUE |
| | RESULT IDENTIFIER | RESULT VALUE |
| | RESULT IDENTIFIER | RESULT VALUE |
| | ⋮ | |
| | RESULT IDENTIFIER | RESULT VALUE |
| | ⋮ | |
| SIMULATION-TIME VALUE | RESULT IDENTIFIER | RESULT VALUE |
| | RESULT IDENTIFIER | RESULT VALUE |
| | RESULT IDENTIFIER | RESULT VALUE |
| | ⋮ | |
| | RESULT IDENTIFIER | RESULT VALUE |

FIG. 3A

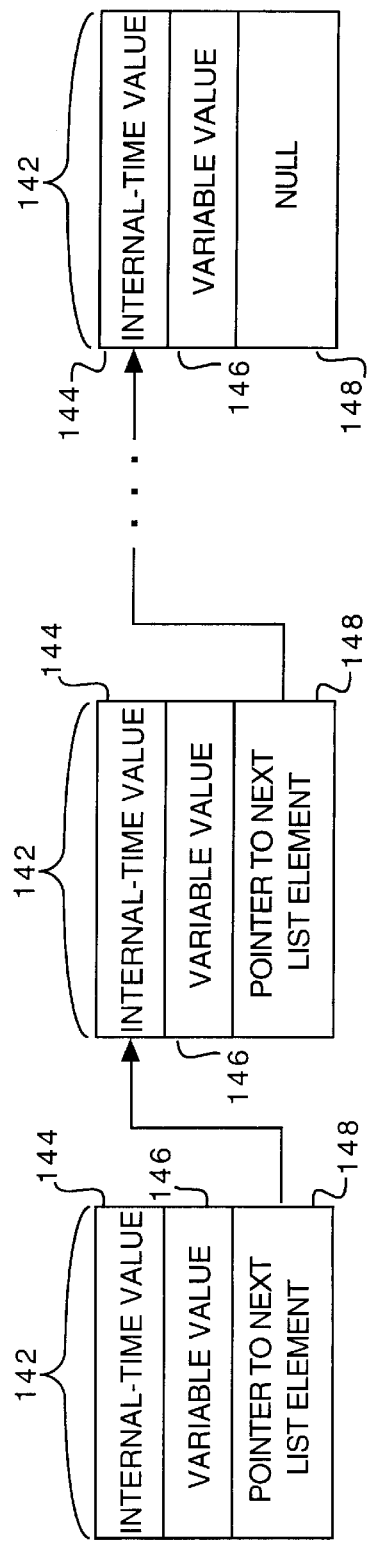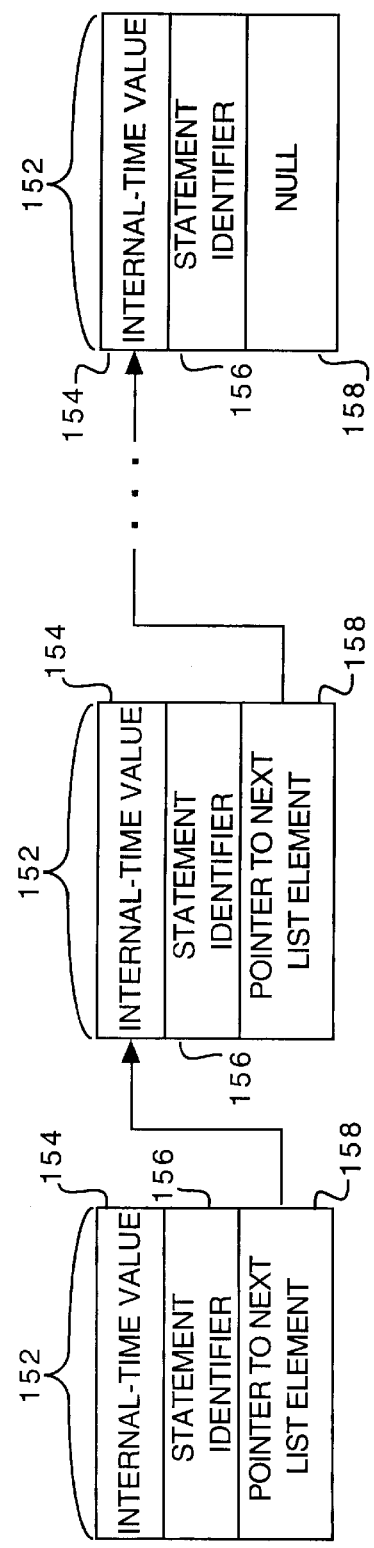
FIG. 5B
FIG. 5C

SYSTEM AND METHOD FOR EXECUTION-SEQUENCED PROCESSING OF ELECTRONIC DESIGN SIMULATION RESULTS

BACKGROUND OF THE INVENTION

1. Field of the Invention

The present invention relates generally to systems and methods for electronic design simulation, and more particularly to systems and methods for processing electronic design simulation results. Still more particularly, the present invention is a system and method for execution-sequenced processing of electronic design simulation results.

2. Description of the Background Art

Electronic circuit designs are commonly subjected to computer simulation to predict circuit behavior before proceeding with actual circuit manufacture. Prior to simulation, an electronic circuit design and one or more corresponding simulation processes are described using simulation code written in accordance with a hardware description language. Various hardware description languages currently exist, with Verilog and Very High-Speed Integrated Circuit Hardware Description Language (VHDL) being the two best-known examples. Each simulation process defines a manner in which variables are assigned values and signals are applied to elements within the design at particular simulation-times. After the electronic circuit design and the corresponding simulation processes have been described according to a hardware description language, the design is simulated using an electronic design simulator such as Verilog-XL (Cadence Design Systems, Inc., San Jose, Calif.).

In general, when an electronic circuit design is simulated, simulation proceeds stepwise according to a set of discrete simulation-times. Simulation processes defined as occurring at a first simulation-time are executed, giving rise to a first set of simulation results. These simulation processes are repeatedly executed until the simulation results become stable for the first simulation-time. Each time the simulation processes are executed, an additional set of simulation results is generated. In even moderately complex simulations, one or more simulation processes may be executed many times, possibly many thousand times, before the simulation results stabilize. After the simulation results become stable for the first simulation-time, the simulation-time is incremented. Simulation processes defined as occurring at a second simulation-time are then executed in a like manner, generating more simulation results. Thus, simulation typically generates a tremendous amount of data.

In an actual circuit, multiple operations upon signals often occur concurrently. Hardware description languages therefore facilitate the definition of concurrent simulation processes, that is, simulation processes that are defined as occurring at an identical simulation-time. Simulation processes that are specified as concurrent are actually executed sequentially during simulation. The order in which concurrent simulation processes are sequentially executed depends upon 1) the order in which these processes are described in the design sources; 2) the design sources' compilation and linking processes; 3) the structure of the simulation code defining the simulation processes; and 4) the simulator itself. The simulator may be free to determine a sequential ordering for a collection of simulation processes that are specified as being concurrent. Different simulators may therefore optimize simulation performance by ordering simulation processes in different manners.

Ideally, simulation results should be independent of the order in which simulation processes specified as concurrent are sequentially executed. Poorly-written simulation code, however, may give rise to a dependency between two or more simulation processes, such that the simulation results obtained depend upon the order in which each simulation process has been executed. For example, if a first simulation process assigns a new value to a variable, and a second simulation process uses the value of this variable, the simulation result obtained depends upon simulation process execution order. Different simulators or even the same type of simulator running on a different type of computer may therefore produce different simulation results depending upon the order in which such simulation processes are executed. Thus, in general, when identical simulation code is executed by different simulators or upon different computers, execution-order dependencies may produce non-identical simulation results. Such dependencies may result in unpredictable behavior in the as-fabricated circuit, and are therefore highly undesirable.

When multiple concurrent simulation processes each assign a unique value to the same variable or signal, incorrect simulation results may be obtained even when the simulation is performed by a single simulator on a single computer system. Even if the stable value of the variable or signal for the simulation-time under consideration is the expected value, multiple changes in a variable or signal during the execution of such simulation processes may also give rise to unpredictable behavior in the as-fabricated circuit.

With regard to simulators executing on multiprocessor workstations, the aforementioned problems may result in simulation results that depend upon processor assignment algorithms and machine-environment factors such as processor loads. Thus, two simulations of the same design by the same simulator on the same workstation could produce different results. Simulation-tool vendors are therefore unable to guarantee simulation behavior repeatability.

Due to the amount of data that can be generated during simulation, prior art systems and methods for processing electronic design simulation results consider only the stable simulation results obtained for each simulation-time. Referring now to FIG. 1A, a graphical representation of a set of exemplary electronic design simulation results output by a first simulator and presented by the prior art is shown. In FIG. 1A, three signals are shown, namely, a periodic clock signal, a signal labeled as "signal 1," and a signal labeled as "signal 2." As can be seen in FIG. 1A, signal 1 transitions to a high value at simulation-time increment t4, and signal 2 transitions to a low value at simulation-time increment t5.

It is assumed herein that the simulation results shown in FIG. 1A are the expected results for the simulation code from which they were obtained. Even though the results in FIG. 1A are the expected results, one or more signals may have undesirably experienced multiple transitions at one or more simulation-times prior to arriving at stable values during simulation. In the prior art, however, such multiple transitions are not detected.

Referring now to FIG. 1B, a graphical representation of a set of exemplary electronic design simulation results output by a second simulator and presented by the prior art is shown. It is assumed herein that the exemplary simulation results of FIGS. 1A and 1B are generated from identical simulation code. In FIG. 1B, signal 1 transitions to a high value at simulation-time increment t4, just as in FIG. 1A. However, signal 2 does not transition to a low value at simulation-time increment t5, and therefore a dependency is present.

Prior art systems and methods for processing electronic design simulation results do not provide an indication as to when or how unexpected behavior or dependencies arose during the execution of simulation code. Rather, a time-intensive and often complex debugging procedure is required to determine this information. What is needed is a means for presenting electronic design simulation results that indicates when multiple transitions, unexpected behavior, or dependencies arose during the execution of simulation code.

SUMMARY OF THE INVENTION

The present invention is a system and method for execution-based processing of electronic design simulation results. The system of the present invention comprises a processing unit, an input device, an output or display device, a nonvolatile storage device, and a memory wherein viewing and interface tools, a simulator, a simulator interface unit, a history file manager, an internal-time counter, and a results data server reside.

In the preferred embodiment, the simulator is a conventional electronic design simulator that outputs simulation results in a simulation-time ordered format. Preferably, the simulator outputs simulation results in a message-based format, where each message includes a simulation-time value, a result identifier, a result value, and a user-definable data item. The present invention is equally applicable, however, to other simulation result formats.

The viewing and interface tools determine a set of variables and/or simulation code statements to be monitored during a simulation. During a simulation, the simulator interface unit receives each simulation result generated that corresponds to a variable or statement being monitored, and stores each such result in a corresponding results list element.

The history file manager processes simulation results within the results list when the simulation-time value changes, or when simulation results are directed to a given results list element more than once during the execution of simulation code associated with a particular simulation-time value.

The history file manager maintains the internal-time counter, which provides an internal-time value that sequentially indicates when a given simulation result was processed relative to the processing of each other simulation result. Because simulation result processing occurs in accordance with the simulator interface unit's receipt of simulation results as output by the simulator, the internal-time value advantageously indicates when during the execution of simulation code a particular simulation result was generated with respect to the generation of each other simulation result.

When processing the results list elements, the history file manager stores the simulation result associated with a particular variable identifier as well as the current internal-time value in a corresponding variable history list element. The history file manager also stores simulation results associated with simulation code statement traces, as well as corresponding internal-time values, within elements of a trace history list. The history file manager additionally maintains a time translation table that associates each unique simulation-time value with an internal-time value.

The history file manager selectively stores processed simulation results upon the nonvolatile storage device when the amount of memory occupied by the processed results has reached a predetermined limit. When the processed simulation results are to be stored upon the nonvolatile storage device, the history file manager creates a variable history table from each variable history list, and a trace history table from the trace history list. The history file manager creates a variable block structure that includes the time translation table as well as these variable history tables, and stores the variable block structure upon the nonvolatile storage device. In a like manner, the history file manager creates and stores upon the nonvolatile storage device a trace block structure that includes the time translation table and the trace history table. Preferably, the variable history tables associated with a common variable identifier and stored in different variable block structures are linked together via a sequence of pointers.

In the presentation of simulation results, the viewing and interface tools generate a variable display list that indicates variable identifiers for which simulation result histories are to be presented. The history file manager retrieves the simulation result history for each such variable identifier, where the simulation result history includes each simulation-time value/variable value pair as well as each recorded internal-time value/variable value pair within the set of variable history tables stored across the variable block structures. That is, each variable identifier's simulation result history comprises the sequence of simulation results that the simulator interface unit and the history file manager had recorded, or stored, for that variable identifier.

The results data server determines whether simulation result histories are to be presented according to a simulation-time format, in which final variable values generated at each simulation-time value are to be presented; or a sequence-time format, in which variable values generated at the beginning of each simulation-time value, as well as each subsequent variable value change, are to be presented.

In the event that simulation result histories are to be presented according to the simulation-time format, the results data server collects the final variable results generated for each simulation-time value. The results data server also generates a simulation-time marker list that indicates for each variable identifier whether multiple variable assignments had occurred during the execution of simulation code associated with each particular simulation-time value. The viewing and interface tools present the final variable results generated for each simulation-time value upon the output device, and also selectively generate a set of simulation-time markers, each of which visually indicates for a given variable identifier a particular simulation-time value at which multiple variable assignments had occurred. In response to a user-selection of a particular simulation-time marker via the input device, the viewing and interface tools initiate the sequence-time format presentation of simulation result histories associated with a particular simulation-time value.

In the event that simulation result histories are to be presented according to the sequence-time format, the viewing and interface tools determine a starting and an ending simulation-time value across which the sequence-time format is to be applied. For each variable identifier of interest, the results data server transfers the variable value generated at the starting simulation-time value, plus each subsequent variable value change that occurred through the final variable value generated during the execution of simulation code associated with the ending simulation-time value, to the viewing and interface tools. The viewing and interface tools display or present the sequence of variable value changes upon the output device.

The present invention thus provides a means for indicating 1) simulation-time values for which multiple assignments to a single variable had occurred; and 2) a sequence of variable value transitions within the context of any given simulation-time value, where the variable value transition sequence corresponds to simulation code statement execution-order. The present invention advantageously makes simulation result interpretation and simulation code debugging a much more efficient process than had previously been possible.

BRIEF DESCRIPTION OF THE DRAWINGS

FIG. 3A is a block diagram representation of simulation-time-ordered simulation results generated by an electronic design simulator;

FIG. 5B is a block diagram of a preferred embodiment of a variable history list of the present invention;

FIG. 5C is a block diagram of a preferred embodiment of a trace history list of the present invention;

DETAILED DESCRIPTION OF THE PREFERRED EMBODIMENTS

Figure 1A:
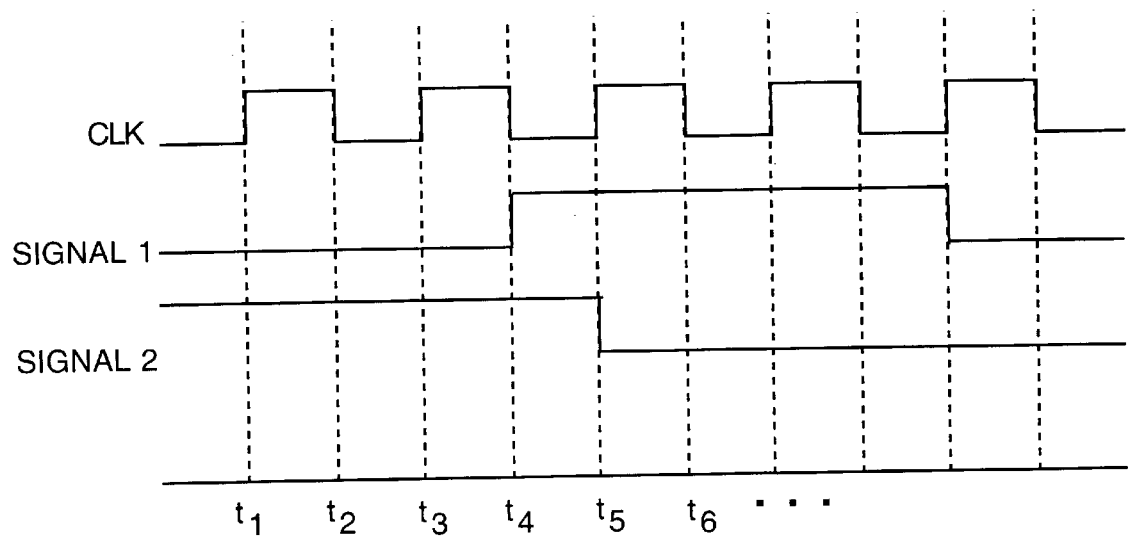
FIG. 1A is a graphical representation of a set of exemplary electronic design simulation results output by a first simulator and presented by the prior art.
Figure 1B:
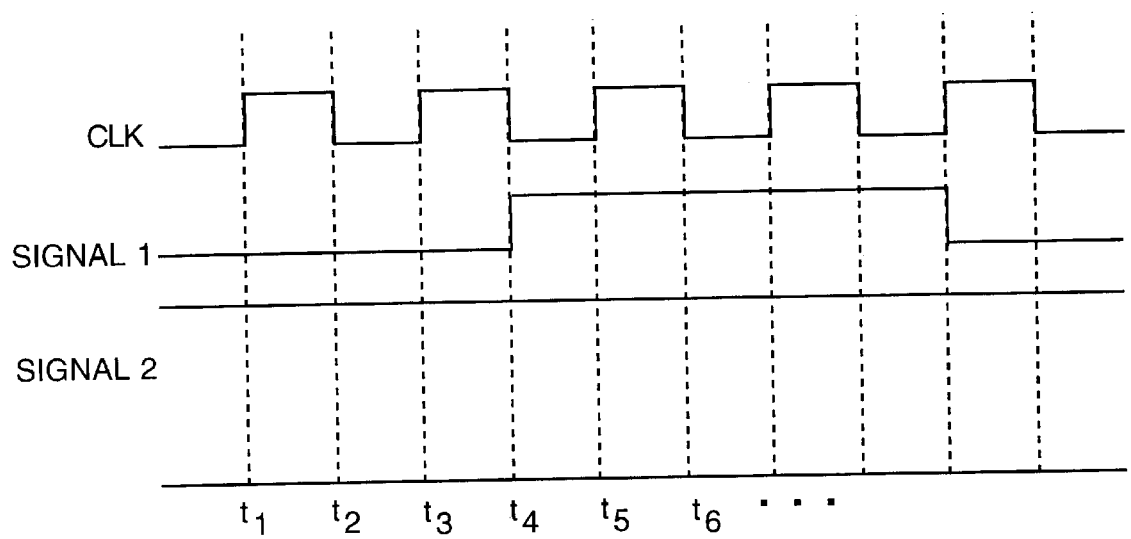
FIG. 1B is a graphical representation of a set of exemplary electronic design simulation results output by a second simulator and presented by the prior art.
Figure 2:
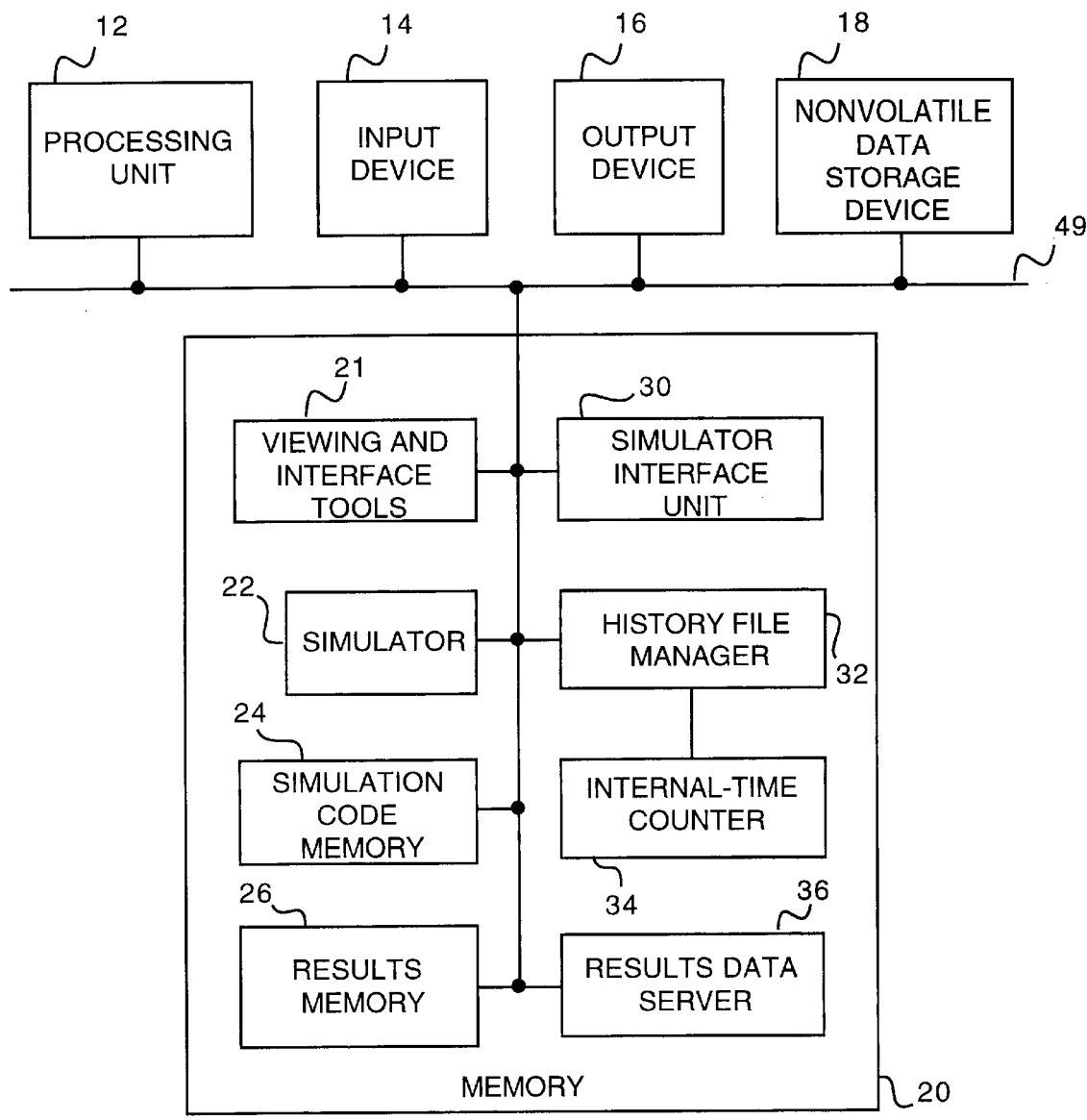
FIG. 2 is a block diagram of a preferred embodiment of a system for execution-sequenced processing of electronic design simulation results constructed in accordance with the present invention.

Referring now to FIG. 2, a block diagram of a preferred embodiment of a system 10 for execution-sequenced processing of electronic design simulation results constructed in accordance with the present invention is shown. The system 10 comprises a processing unit 12, an input device 14, an output device 16, a non-volatile data storage device 18, and a predetermined amount of memory 20 wherein viewing and interface tools 21, a simulator 22, a simulation code memory 24, a results memory 26, a simulator interface unit 30, a history file manager 32, an internal-time counter 34, and a results data server 36 reside. The internal-time counter 34 is coupled to the history file manager 32. The other elements of the system 10 are coupled to a common system bus 49.

In the preferred embodiment, each of the simulator 22, the viewing and interface tools 21, the simulator interface unit 30, the history file manager 32, the internal-time counter 34, and the results data server 36 comprise a sequence of program instructions stored in the memory 20 and executable by the processing unit 12. In an exemplary embodiment, the system 10 is a Sun SparcStation (Sun Microsystems, Inc., Palo Alto, Calif.) having a SuperSparc processor, a keyboard and a mouse, a high-resolution monitor, a 1 Gigabyte or larger hard disk drive, and 32 Megabytes of memory wherein the viewing and interface tools 21, a simulator 22, the simulator interface unit 30, the history file manager 32, the internal-time counter 34, and the results data server 36 reside.

The viewing and interface tools 21 preferably provide a graphical user interface that facilitates the entry of simulation code as well as data and commands for communicating with the simulator interface unit 30 via the input device. As will be described in detail below, the viewing and interface tools 21 also operate in conjunction with the results data server 36 to provide a graphical history of variable and statement execution activity that occurred during a simulation. In the preferred embodiment, the viewing and interface tools 21 comprise a sequence of program instructions stored in the memory 20 and executable by the processing unit 12.

The simulator 22 is preferably a conventional electronic design simulator such as Verilog-XL or Leapfrog (Cadence Design Systems, Inc., San Jose, Calif.) capable of performing behavioral simulations under the direction of simulation code stored in the simulation code memory 24. The simulation code defines one or more simulation processes that occur at specific simulation-times, and is preferably written in accordance with a conventional hardware description language such as Verilog or Very High-Speed Integrated Circuit Hardware Description Language (VHDL). Those skilled in the art will recognize that the simulator 22 comprises a sequence of program instructions stored in the memory 20 and executable by the processing unit 12.

The simulator 22 initiates simulation operations in response to a call received from the simulator interface unit 30. During the simulation of an electronic circuit design, the simulator 22 outputs simulation results to the results memory 26. Those skilled in the art will recognize that a conventional simulator 22 outputs simulation results in a simulation-time-ordered format. Referring now to FIG. 3A, a graphical representation of simulation-time-ordered simulation results as output by a conventional simulator 22 is shown. At the beginning of simulation, and after each simulation-time increment, the simulator 22 generates a simulation-time value. For each simulation result generated during the simulation-time currently under consideration, the simulator 22 generates a result identifier and a corresponding result value. Upon simulation completion, the simulator 22 issues a simulation completion signal. Those skilled in the art will recognize that the teachings of the present invention are applicable to any simulator 22 that outputs simulation results in a simulation-time-ordered format.

Figure 3B:
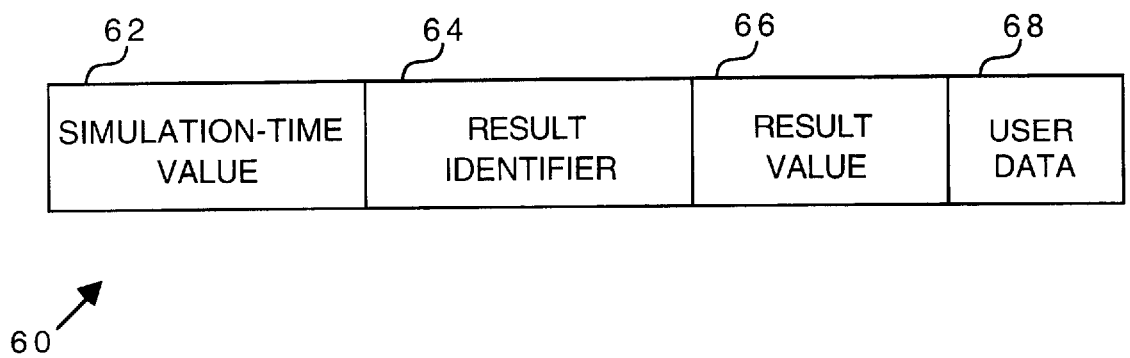
FIG. 3B is a block diagram of a message structure output by an electronic design simulator.

In the preferred embodiment, the simulator 22 selectively outputs simulation-time values, result identifiers, and corresponding result values to the simulator interface unit 30 in a conventional message-based format. Referring also now to FIG. 3B, a block diagram of a preferred embodiment of a message structure 60 output by the simulator 22 is shown. The message structure 60 is preferably conventional, and comprises a first data field 62 for storing a current simulation-time value; a second data field 64 for storing a result identifier; a third data field 66 for storing a result value corresponding to the result identifier; and a fourth data field 68 for storing a user-definable data item referred to herein as "user data." The user data can be defined differently from one result identifier to another, in a conventional manner recognizable to those skilled in the art. In the present invention, the user data is preferably defined to optimize the processing of messages by the simulator interface unit 30, as described in detail below.

In the present invention, a simulation result can be generated by a variable assignment, a signal assignment, or a simulation code execution trace. In the event that the simulation result is generated by a variable or signal assignment, the result identifier is a conventional reference to a variable or signal name, respectively, and the result value is the respective value associated with the variable or signal name. In the event that the simulation result is generated by a simulation code execution trace, the result identifier is a statement execution signal indicating that a simulation code execution trace was activated, and the result value is a reference to a particular simulation code statement. Herein, simulation results resulting from variable or signal assignments are collectively referred to as variable results, which comprise a variable identifier/variable value pair and a corresponding user data item. Similarly, simulation results generated by a simulation code execution trace are referred to herein as trace results, which comprise the statement execution signal, a reference to a particular simulation code statement, and a user data item.

The simulator interface unit 30 communicates with the viewing and interface tools 21 to determine a set of variables (which herein may include signals) and/or simulation code statements that are to be monitored during simulation code execution. The simulator interface unit 30 receives simulation results corresponding to this set of variables and statements during simulation code execution, and communicates with the history file manager 32 to perform results processing operations. The history file manager 32 maintains an internal-time counter 34 that provides an internal-time value indicating when simulation activity associated with a particular variable or statement occurred within any particular simulation-time interval. The detailed operations performed by the simulator interface unit 30 and the history file manager 32 are described hereafter.

The discussion herein assumes that both variables and statement executions are to be monitored during simulation code execution. Those skilled in the art will recognize that monitoring both variables and statement executions is not required; for example, a set of variables could be monitored while statement executions might not be considered. In the preferred embodiment, a system user indicates a set of variables and statements that are to be monitored by input-device selection from a list generated by the viewing and interface tools 21, which transfer this set of variables and statements to be monitored to the simulator interface unit 30. The simulator interface unit 30 then issues a call to the simulator 22 to obtain a variable identifier and a statement identifier for each variable and statement to be monitored, respectively.

Figure 4:
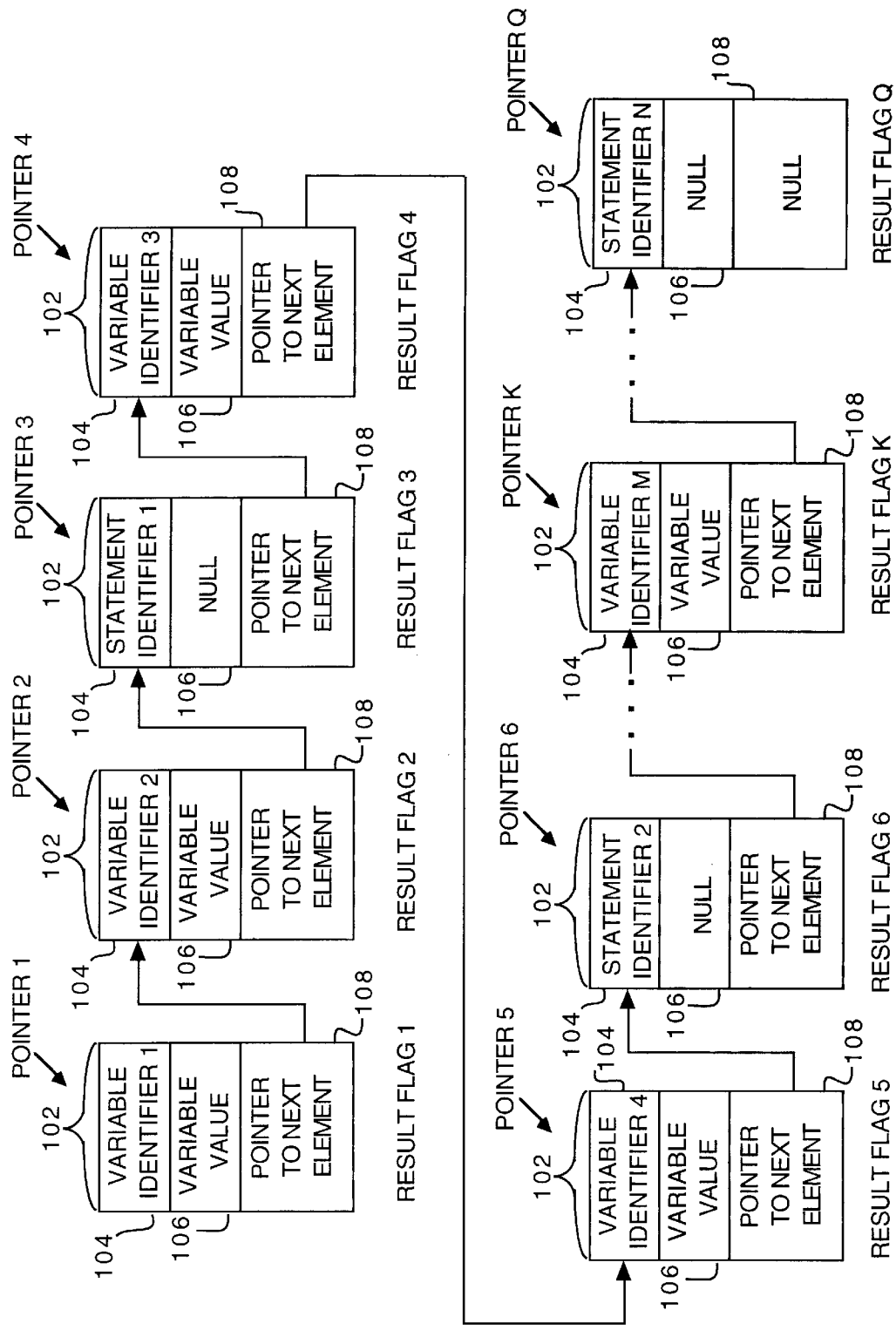
FIG. 4 is a block diagram of a preferred embodiment of a results list of the present invention and a preferred relationship between results list elements, result pointers, and result flags.

Upon receiving these variable and statement identifiers from the simulator 22, the simulator interface unit 30 stores them in the memory 20. The simulator interface unit 30 next creates a results list 100. Referring now to FIG. 4, a block diagram of a preferred embodiment of a results list 100 is shown. The results list 100 preferably comprises a linked-list in which each list element 102 includes a first data field 104 for storing either a variable identifier or a simulation code statement identifier; a second data field 106 for storing either a variable value or a null value; and a third data field 108 for storing a pointer to a subsequent element 102 within the results list 100. Those skilled in the art will recognize that in an alternate embodiment, the results list 100 could be implemented using another type of data structure.

In the preferred embodiment, the results list 100 includes an element 102 for each variable or statement to be monitored during simulation code execution. Thus, the results list 100 preferably comprises a number of elements 102 equal to the number of variables and statements to be monitored, where each results list element 102 corresponds to a particular variable or statement to be monitored. During simulation code execution, the simulator interface unit 30 receives messages containing simulation results from the simulator 22, where the messages preferably have the format previously described with reference to FIG. 3B. Each simulation result received corresponds to a variable or statement being monitored. The simulator interface unit 30 stores the result value within each such simulation result in a results list element 102 that corresponds to the result identifier associated with the result value. The simulator interface unit 30 selectively issues a results list processing signal to the history file manager 32, as described in detail below.

During the creation of the results list 100, the simulator interface unit 30 creates a unique pointer to each individual element 102 within the results list 100. As will be described in detail below, this set of pointers is used to define user data that is returned by the simulator 22 when activity associated with any of the variables or statements to be monitored occurs during simulation code execution.

Figure 5A:
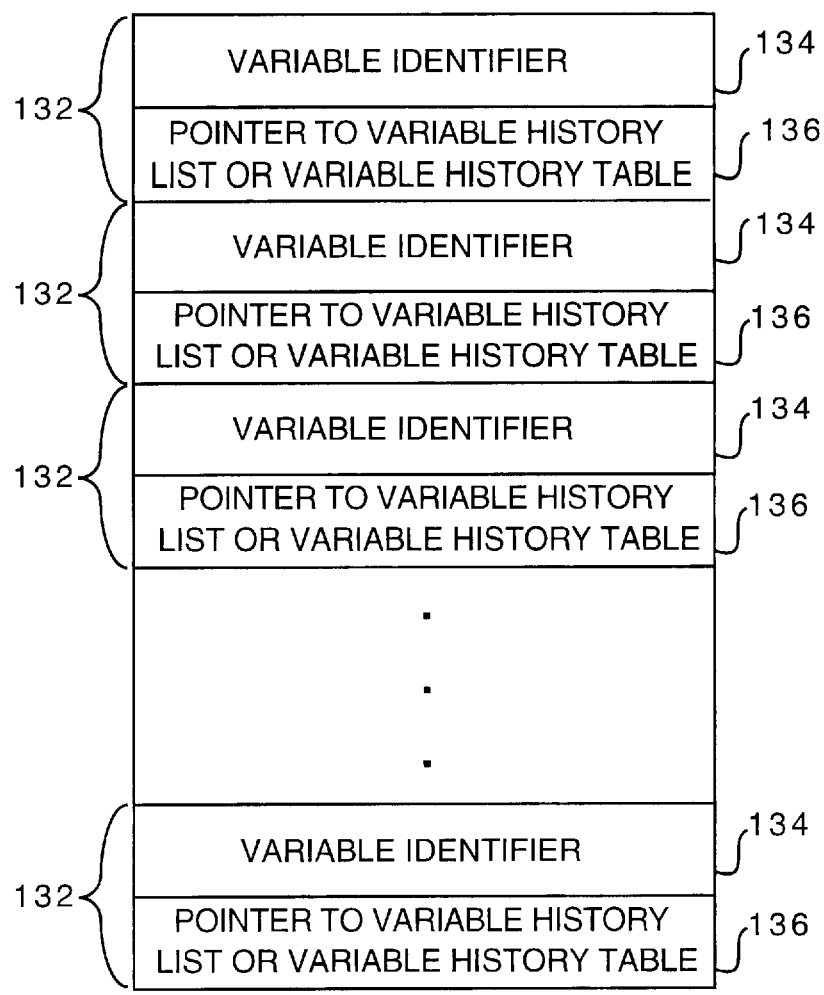
FIG. 5A is a block diagram of a preferred embodiment of a variable history index of the present invention.

The simulator interface unit 30 next creates a variable history index 130 and a set of variable history lists 140. Referring now to FIG. 5A, a block diagram of a preferred embodiment of a variable history index 130 is shown. The variable history index 130 preferably comprises a data structure having a set of list reference fields 132, where each list reference field 132 includes a first data field 134 for storing a variable identifier and a second data field 136 for storing a pointer to a variable history list 140. Referring also now to FIG. 5B, a block diagram of a preferred embodiment of a variable history list 140 is shown. The variable history list 140 preferably comprises a linked list in which each element 142 includes a first data field 144 for storing an internal-time value, a second data field 146 for storing a variable value, and a third data field 148 for storing a pointer to a subsequent element within the variable history list 140.

Each variable history list 140 corresponds to a particular variable to be monitored, and provides a selective record of activity associated with this variable that occurred during simulation code statement execution. Each variable history list 140 is maintained by the history file manager 32, as will be described in detail below. Initially, each variable history list 140 includes a single variable history list element 142. The variable history index 130 serves as an index to a set of variable history lists 140, and thus includes a number of list reference fields 132 equal to the number of variables to be monitored.

In addition to creating the variable history index 130 and a set of variable history lists 140, the simulator interface unit 30 creates a trace history list 150. Referring now to FIG. 5C, a block diagram of a preferred embodiment of a trace history list 150 is shown. The trace history list 150 preferably comprises a linked list in which each element 152 includes a first data field 154 for storing an internal-time value, a second data field 156 for storing a statement identifier, and a third data field 158 for storing a pointer to a subsequent trace history list element 152. Initially, the trace history list 150 is a single-element list. The trace history list 150 is maintained by the history file manager 32, and provides a record of activity associated with the set of statements to be monitored during simulation code execution.

Figure 6A:
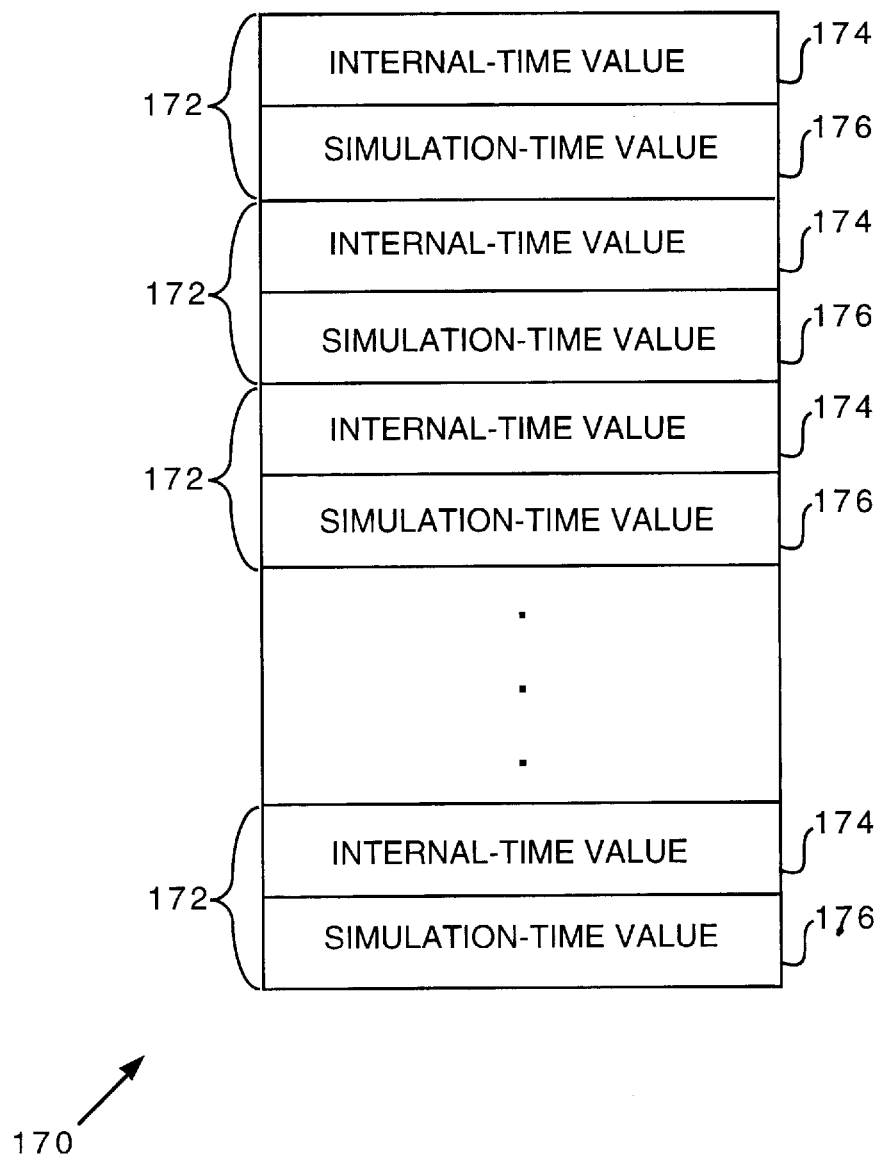
FIG. 6A is a block diagram of a preferred embodiment of a time translation table of the present invention.

Following the creation of the variable history index 130, the set of variable history lists 140, and the trace history list 150, the simulator interface unit 30 creates a time translation table 170. Referring now to FIG. 6A, a block diagram of a preferred embodiment of a time translation table 170 is shown. The time translation table 170 comprises an array having a set of time history fields 172, where each time history field 172 comprises a first data field 174 for storing an internal-time value and a second data field 176 for storing a simulation-time value. In the preferred embodiment, the time translation table 170 is a dynamically allocated array. As described in detail below, for monitored variables and statements, the time translation table 170 provides a sequential mapping of simulation activity that occurred during, or within, each simulation time interval. The time translation table 170 is maintained by the history file manager 32.

In the preferred embodiment, the results list 100, the variable history index 130, each variable history list 140, the trace history list 150, and the time translation table 170 are created and subsequently maintained in the results memory 26.

The simulator interface unit 30 next calls the simulator 22 with a list of variable and statement identifiers, thereby indicating those variables and statements for which messages containing simulation results are to be output (i.e., the variables and statements to be monitored). Included with this list of variable and statement identifiers is the user data that the simulator is to return for each variable and statement. In the preferred embodiment, for each particular monitored variable or statement, the user data comprises the pointer to the respective variable or statement's corresponding element 102 within the results list 100. Thus, when the simulator 22 outputs a message containing a simulation result, the simulator interface unit 30 directly stores the value associated with this simulation result in the appropriate results list element 102 by using the pointer returned with the simulation result.

The simulator 22 subsequently initiates a simulation. During the simulation, the simulator 22 preferably outputs simulation results in the message-based format described above with reference to FIG. 3B, thereby associating each result identifier with a pointer to a particular results list element 102 via the message's user-data item. The simulator interface unit 30 receives each such simulation result via a call received from the simulator 22, and stores the result value in the results list element 102 indicated by the pointer returned as user data with the simulation result.

The simulator interface unit 30 maintains a result flag for each monitored variable or statement. Each such result flag indicates whether more than one simulation result has been received for its corresponding variable or statement during a current simulation-time. For a variable, receipt of more than one simulation result during the current simulation-time indicates simulation code that makes multiple variable assignments, which in turn may indicate the existence of an execution-order dependency or poorly written simulation code. The existence of multiple variable assignments during a given simulation-time interval may result in unpredictable or unreliable behavior in a fabricated circuit. Receipt of more than one simulation result for a statement during the current simulation-time may also indicate the existence of an execution order dependency or poorly written simulation code. In stark contrast to the present invention, prior art systems and methods related to electronic design simulation do not provide any automatic means for examining simulation results relative to multiple variable assignments or statement executions within a given simulation-time.

As previously indicated, the simulator interface unit 30 selectively issues a results list processing signal to the history file manager 32 as simulation results are received from the simulator 22. The history file manager 32 in response updates the variable history lists 140, the trace history list 150, and the time translation table 170. In the preferred embodiment, the simulator interface unit 30 issues the results list processing signal in the event that 1) the simulation time value output by the simulator 22 has changed; or 2) an additional simulation result has been received for one of the monitored variables or statements during the current simulation-time. The results list processing signal preferably specifies which of the two above conditions has occurred.

In response to the results list processing signal, the history file manager 32 selects a first results list element 102. If the results list processing signal indicates that the simulation-time value output by the simulator 22 has changed, the history file manager 32 next updates the time translation table 170, thereby associating the simulation result within the selected results list element 102 with the current internal-time value and the current simulation-time value.

Regardless of whether results list processing is initiated in response to a simulation-time value change, the history file manager 32 updates the variable history list 140 associated with the selected results list element 102 in the event that the selected results list element 102 stores a variable result. Otherwise, the history file manager 32 updates the trace history list 150. The history file manager 32 next increments the internal-time counter 34, unless the selected results list element 102 corresponds to the first variable activity immediately following a trace result. The history file manager 32 repeats the above process for each remaining results list element 102.

When the variable history list 140 or the trace history list 150 have a single element, the history file manager 32 performs the first updating of the variable history list 140 or the trace history list 150 by storing appropriate values within an already-existing list element. The history file manager 32 performs subsequent list updates by creating a new list element, storing appropriate values within the newly-created list element, and linking the newly-created list element to a previously-created list element.

In general, the simulator 22 produces a very large number of simulation results even for the simulation of a relatively simple electronic design. The large number of simulation results produced can easily exceed the data storage capacity of the memory 20. After updating the set of result history lists 140, the time translation table 170, and/or the trace history list 150, the history file manager 32 determines whether the amount of memory 20 required to store the set of result history lists 140, the time translation table 170, and the trace history list 150 has reached a predetermined limit.

In the preferred embodiment, the predetermined limit is 5 megabytes. In the event that the predetermined memory size limit has been reached, the history file manager 32 performs result transfer operations in which the contents of the results lists 140, the trace history list 150, and the time translation table 170 are transferred into a variable block structure 200 and a trace block structure 220 and stored upon the nonvolatile storage device 18, as described in detail hereafter.

Figure 6B:
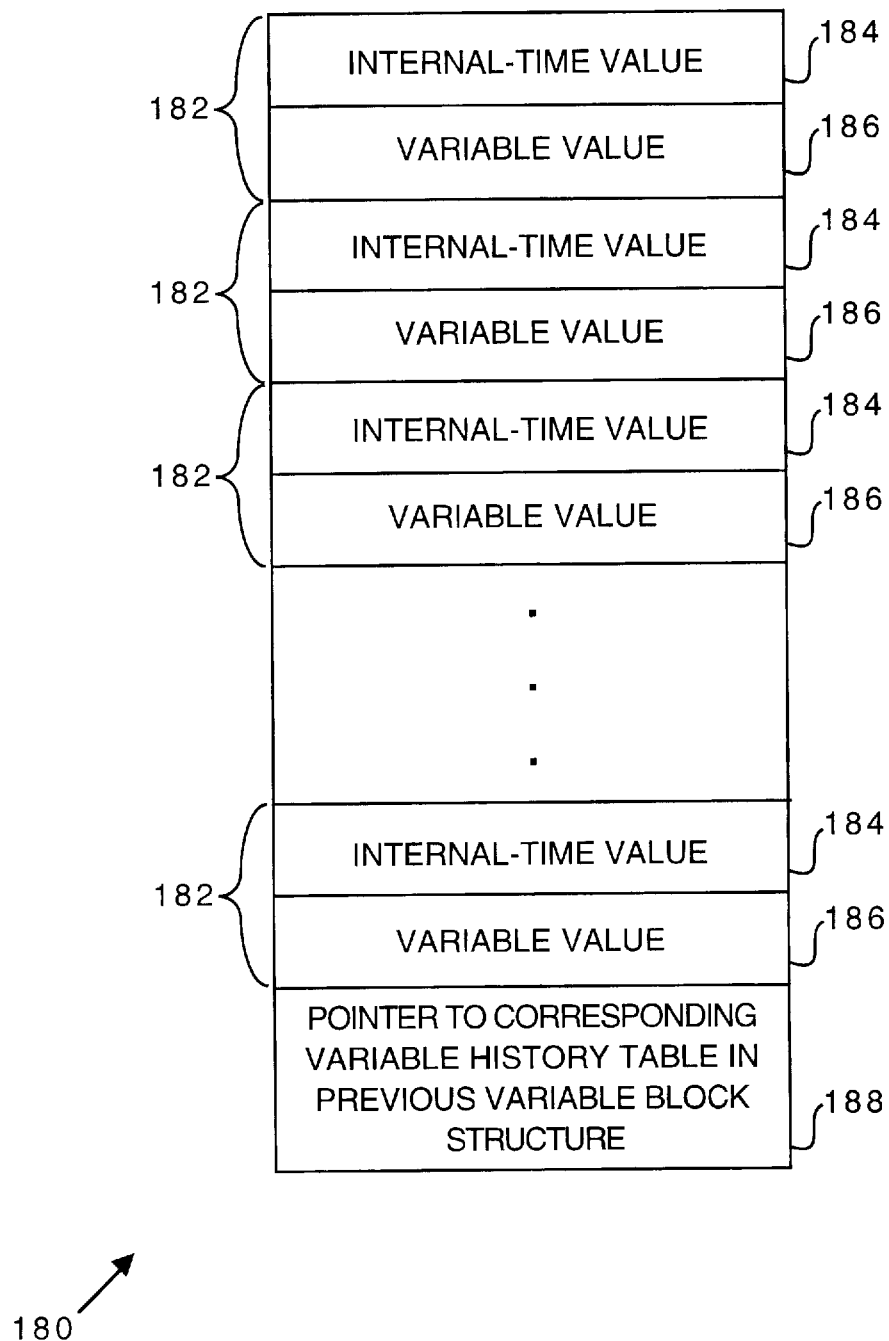
FIG. 6B is a block diagram of a preferred embodiment of a variable history table of the present invention.

In the result transfer operations, the history file manager 32 generates a variable history table 180 corresponding to each variable history list 140. Referring now to FIG. 6B, a block diagram of a preferred embodiment of a variable history table 180 is shown. Each variable history table 180 preferably comprises an array for storing the contents of a particular variable history list 140. Each variable history table comprises a set of variable history fields 182, where each variable history field 182 includes a first data field 184 for storing an internal-time value and a second data field 186 for storing a variable value corresponding to the internal time value. Each variable history table 180 additionally comprises a variable link field 188 for storing a pointer to a corresponding variable history table 180 within a previous variable block structure 200, as described in detail below.

Figure 6C:
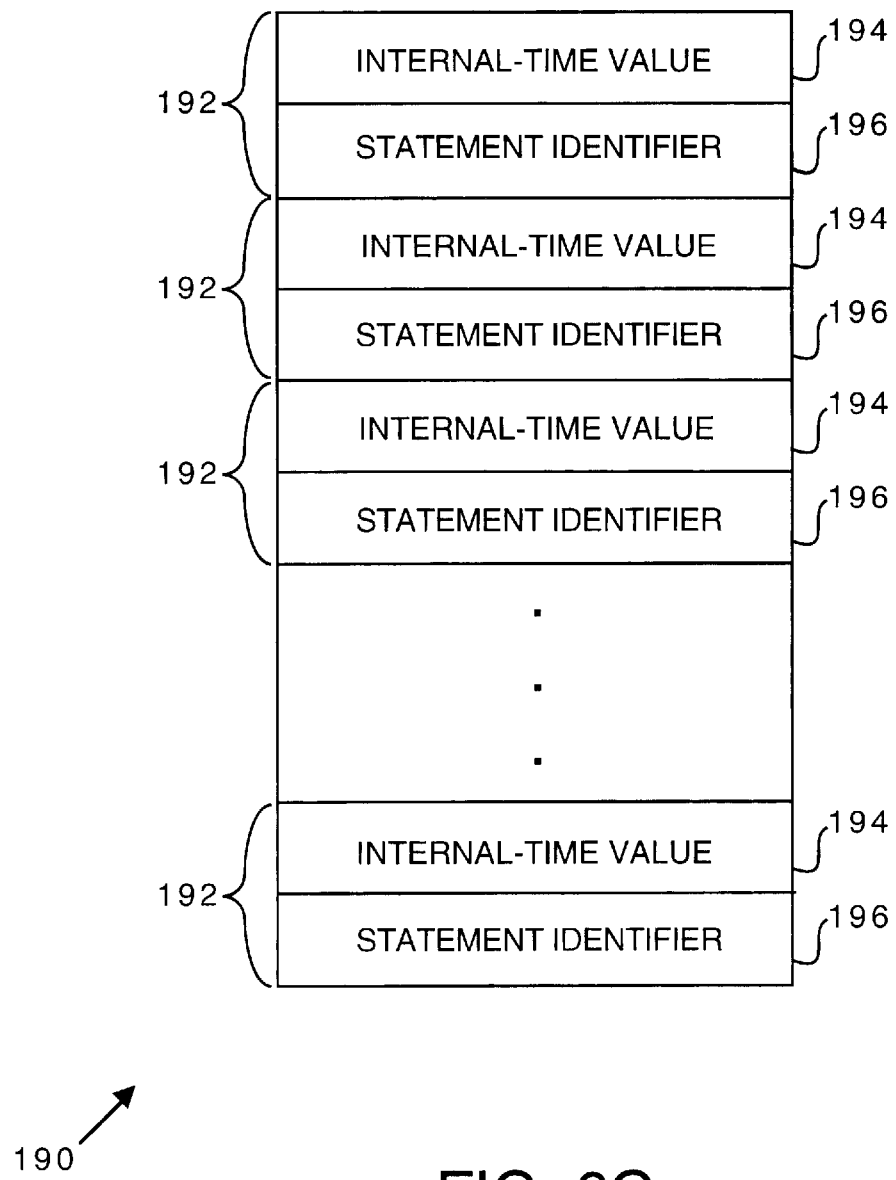
FIG. 6C is a block diagram of a preferred embodiment of a trace history table of the present invention.

In addition to generating variable history tables 180, the history file manager 32 also generates a trace history table 190. Referring now to FIG. 6C, a block diagram of a preferred embodiment of a trace history table 190 is shown. The trace history table preferably comprises an array for storing the contents of the trace history list 170. The trace history table 190 comprises a set of trace history fields 192, where each trace history field 192 includes a first data field 194 for storing an internal-time value and a second data field 196 for storing a statement identifier. The trace history table 190 also comprises a trace link field 198 for storing a pointer to a trace history table 190 within a previous trace block structure 220, as described in detail below.

Figure 7A:
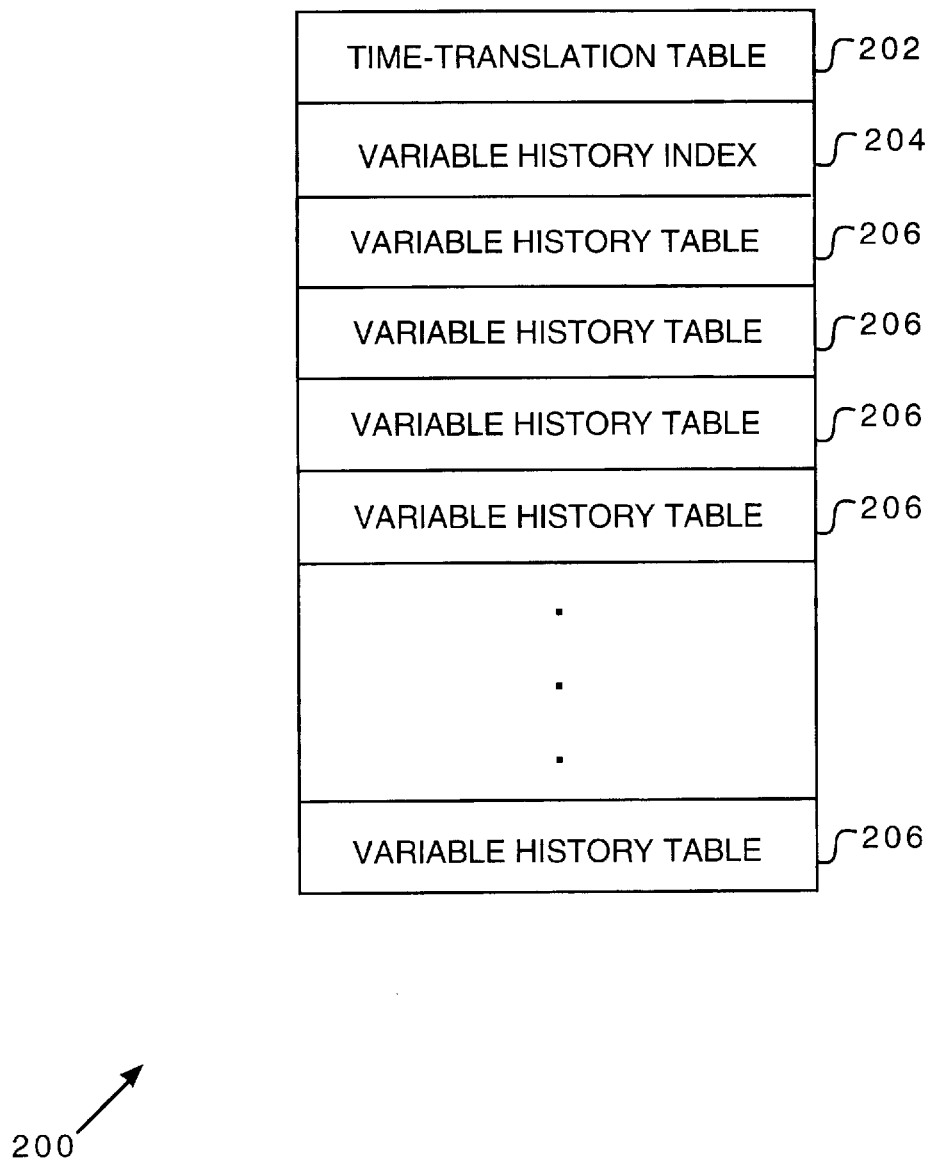
FIG. 7A is a block diagram of a preferred embodiment of a variable block structure of the present invention.

After generating the time translation table 170 and the set of variable history tables 180, the history file manager 32 creates a variable block structure 200. Referring now to FIG. 7A, a block diagram of a preferred embodiment of a variable block structure 200 is shown. The variable block structure 200 comprises a first data field 202 for storing the time-translation table 170; a second data field 204 for storing the variable history index 130; and a set of table data fields 206, each of which stores a variable history table 180. Thus, by storing each variable history table 180, the variable block structure 200 stores the activity history of each monitored variable during a simulation, where the simulation may span include zero, one, or multiple simulation time intervals.

The history file manager 32 stores the variable block structure 200 on the nonvolatile storage device 18. The history file manager 32 subsequently updates the variable history index 130 within the variable block structure's second data field 204 by replacing each pointer to a variable history list 140 with the address at which the corresponding variable history table 180 resides upon the nonvolatile storage device 18. In this manner, each entry in the variable history index 130 within the variable block structure 200 is modified to reference a nonvolatile storage device address. Each entry in the modified variable history index 130 thus pairs a variable identifier with the nonvolatile storage device address at which a variable history table corresponding to the variable identifier resides.

The time translation table 170 stored within the variable block structure's first data field 202 provides a means for associating an internal-time value stored within a variable history table 180 with a simulation-time value.

Figure 7B:
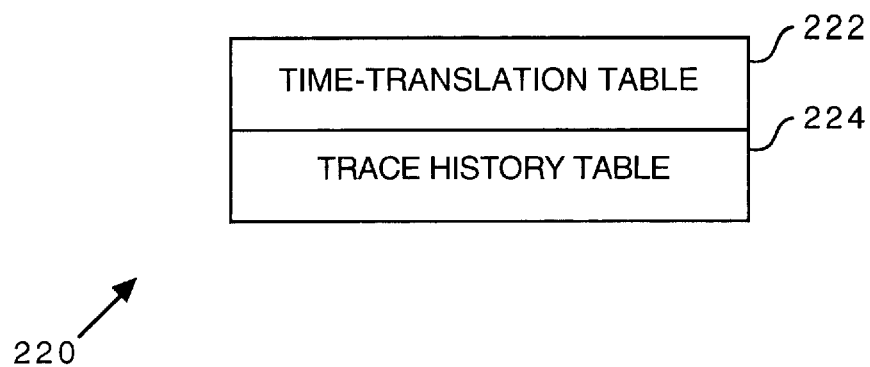
FIG. 7B is a block diagram of a preferred embodiment of a trace block structure of the present invention.

As previously indicated, the history file manager 32 additionally creates a trace block structure 220. Referring now to FIG. 7B, a block diagram of a preferred embodiment of a trace block structure 220 is shown. The trace block structure 220 comprises a first data field 222 for storing the time translation table 170, and a second data field 224 for storing the trace history table 190. Thus, the trace block structure 220 stores a statement activity history during zero, one, or possibly multiple simulation-time intervals. After creating the trace block structure 220, the history file manager 32 stores the trace block structure 220 on the nonvolatile storage device 18.

After storing the variable and trace block structures 200, 220 upon the nonvolatile storage device 18, the history file manager 32 deallocates, or frees, the memory occupied by the time translation table 170, each variable history table 180, and the trace history table 190. The history file manager 32 additionally deallocates the memory occupied by all but the first element of each variable history list 140 and the trace history list 150. Finally, the history file manager 32 allocates a portion of the memory 20 for storing a new time translation table 170. In this manner, the history file manager 32 ensures that memory is available for receiving and processing additional simulation results. Upon completion of the aforementioned memory management operations, the history file manager 32 issues a process completion signal to the simulator interface unit 30.

Upon receiving the process completion signal from the history file manager 32, the simulator interface unit 30 issues a continuation signal to the simulator 22, and resumes message processing operations as described above until results processing operations are again required. Following the first performance of results processing operations, the history file manager 32 stores in each currently-considered variable history table 180 a pointer to a most-recently stored corresponding variable history table 180. In this manner, the history file manager 32 links the variable history tables 180 corresponding to the same result identifier, via a sequence of pointers to nonvolatile storage device addresses.

The set of variable block structures 200 and trace block structures 220 generated during a particular simulation form a simulation results file. As a simulation results file is stored upon the nonvolatile storage device 18, or at a later time in a post-simulation mode, the viewing and interface tools 21, in conjunction with the history file manager 32 and the results data server 36, selectively present simulation results upon the output device 16. In the present invention, simulation results are selectively presented for a subset of monitored variables in either a simulation-time format or an expanded sequence-time format, as described in detail hereafter.

In the presentation of simulation results associated with a given simulation results file, the viewing and interface tools 21 generate a variable display list that defines a subset of monitored variables for which a simulation result history is to be displayed, in response to a user selection received via the input device 14. The viewing and interface tools 21 also generate a presentation format signal according to a user selection received via the input device 14. The viewing and interface tools 21 transfer the variable display list to the history file manager 32.

In response to receiving the variable display list, the history file manager 32 selects a first variable identifier from the variable display list, and then selects the last variable block structure 200 within the simulation results file under consideration. The history file manager 32 determines whether a reference to a variable history table 180 corresponding to the selected variable identifier exists within the selected variable block structure 200. The history file manager 32 makes this determination by examining the variable history index 130 stored in the selected variable block structure's second data field 204. If no reference to a corresponding variable history table 180 exists within the selected variable block structure 200, the history file manager 32 selects the previous variable block structure 200 within the simulation results file, and repeats the above determination. This process is repeated until either each variable block structures 200 within the simulation results file has been considered, or a reference to a corresponding variable history table 180 has been found.

Upon finding a reference to a variable history table 180 corresponding to the selected variable identifier, the history file manager 32 retrieves this variable history table 180 as well as the variable block structure's time translation table 170. The history file manager 32 then examines the retrieved variable history table's variable link field 188. In the event that the variable link field 188 contains a reference to a previous variable history table 180 stored within a previous variable block structure 200, the history file manager 32 retrieves this previous variable history table 180 as well as the corresponding time translation table 170 stored within the previous variable block structure 200.

In the preferred embodiment, the history file manager 32 examines the variable link field 188 of each retrieved variable history table 180. In the event that the variable link field 188 contains a reference to a previous corresponding variable history table 180, the history file manager 32 retrieves this previous corresponding variable history table 180 and the associated time translation table 170 from a previous variable block structure 200.

If the variable link field 188 of a currently-considered variable history table 180 contains a "null" value rather than a reference to a previous corresponding variable history table 180, the history file manager 32 examines the results memory 26 to determine whether a corresponding variable history list 140 exists. If so, the history file manager 32 retrieves the variable history list 140 and the most-recently created time translation table 170, thereby ensuring that the simulation result history retrieval for the selected variable identifier is current with the most-recently generated simulation results.

In the manner described above, the history file manager 32 successively retrieves into the memory 20 the simulation result history associated with the variable identifier currently under consideration, where the simulation result history can comprise a set of variable history tables 180 and time translation tables 170 previously stored upon the nonvolatile storage device 18, and/or a variable history list 140 plus the most-recently created time translation table 170.

The history file manager 32 repeats the above simulation result history retrieval for each variable identifier within the variable display list. In the preferred embodiment, the simulation result history for any given variable identifier includes the associated variable value at 1) the start of each variable recording period; as well as 2) after each associated assignment made during the execution of the simulation code that produced the simulation results file. Once the history file manager 32 has retrieved the simulation result history for each variable identifier within the variable display list, the history file manager 32 issues a retrieval completion signal to the viewing and interface tools 21, which in turn issue the presentation format signal to the results data server 36.

Figure 8A:
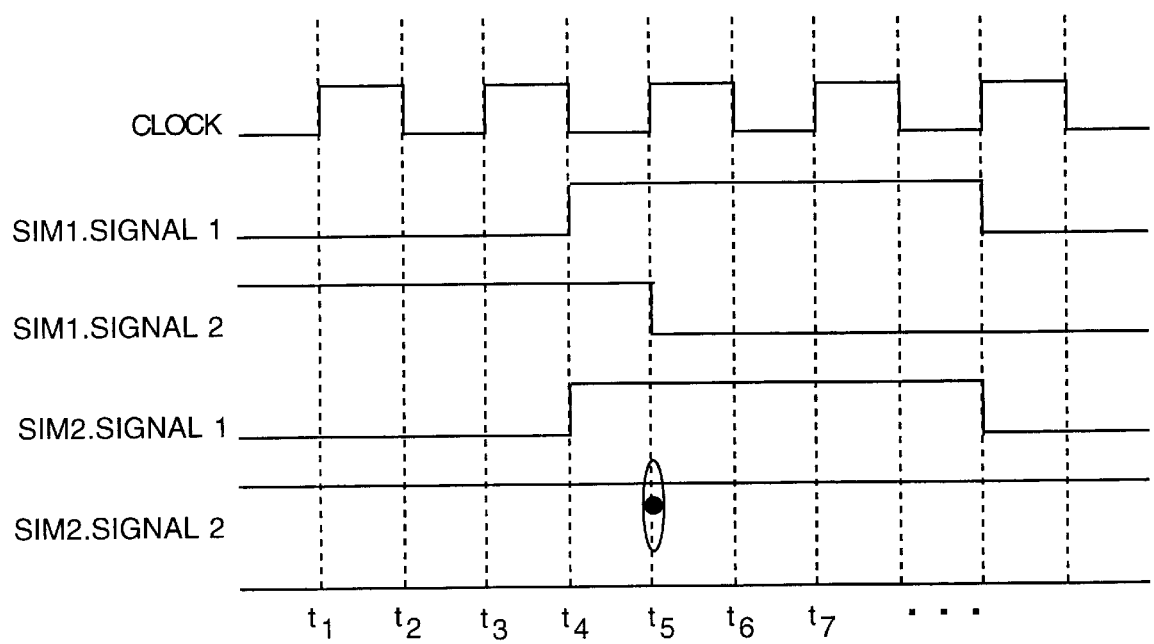
FIG. 8A is a graphical representation of a set of exemplary electronic design simulation results as presented by the present invention in a preferred simulation-time format.

In response to the presentation format signal, the results data server 36 determines whether the retrieved simulation result histories are to be output according to a simulation-time format or a sequence-time format. Referring now to FIG. 8A, a graphical representation of a set of exemplary electronic design simulation results output in a preferred simulation-time format is shown. In the preferred simulation-time format, simulation result histories are represented as waveform versions of variable (or herein, signal) values according to the variable values at the beginning of each simulation time value. In the preferred simulation-time format, a simulation-time marker or indicator is output to denote when multiple assignments had been made to a particular variable during a given simulation-time interval. For example, as shown in FIG. 8A, a simulation-time marker is placed at simulation-time value t5 for the variable "Sim2.Signal 2," indicating that multiple assignments were made to this variable during the execution of simulation code corresponding to the simulation-time value t5.

In the event that the retrieved simulation result histories are to be presented according to a simulation-time format, the results data server 36 selects a first variable identifier within the variable display list, and examines its corresponding simulation result history to determine the final variable value at each simulation-time value. In this determination, the results data server 36 selects a first time translation table 170 and a first variable history table 180 (or the variable history list 140 retrieved by the history file manger 32, as appropriate) corresponding to the first variable identifier. Next, the results data server 36 examines the selected time translation table 170 and determines a first reference simulation-time value, a first reference internal-time value, a second reference simulation-time value, and a second reference internal-time value. In the preferred embodiment, the first and second reference simulation-time and internal-time values are initially defined from the first and second entries within the selected time translation table 170, respectively.

The results data server 36 next searches the selected variable history table 180 for a largest internal-time value that is less than the second reference internal-time value. Upon finding this largest internal-time value, the results data server 36 adds the first reference simulation-time value and the variable value corresponding to the aforementioned largest internal-time value to a waveform value list associated with the selected variable identifier.

While performing the above operations, the results data server 36 also determines whether more than one entry within the selected variable history table 180 has an internal-time value larger than the first reference internal-time value but less than the second reference internal-time value. If so, the results data server 36 adds an entry to a simulation-time marker list, thereby indicating that multiple simulation results were generated for the selected variable identifier within the context of a single simulation-time value. As previously described, the existence of multiple simulation results for a single variable within the context of a single simulation-time value may indicate the presence of a dependency or poorly-written simulation code. In the preferred embodiment, each entry in the simulation-time marker list includes the variable identifier and the first reference simulation-time value.

The results data server 36 subsequently performs operations analogous to those described above such that the second reference simulation-time and internal-time values are redefined as first reference simulation-time and internal-time values, respectively; and the next sequential entry in the time translation table 170 is used to define the second reference simulation-time and internal-time values. The results data server 36 then determines the final variable value generated during the execution of simulation code corresponding to the current first reference simulation-time value, updates the waveform value list, and selectively updates the simulation-time marker list. In the preferred embodiment, the results data server 36 performs the above operations for each variable history table 180 associated with the variable identifier currently under consideration, using the time translation table 170 that is associated with the currently-considered variable history table 180.

The results data server 36 performs the above operations to generate a waveform value list corresponding to each variable identifier within the variable display list. During the generation of each waveform value list, the results data server 36 also preferably updates the simulation-time marker list.

After generating each waveform value list and the simulation-time marker list, the results data server 36 transfers subsets of the waveform value lists and the simulation-time marker list to the viewing and interface tools 21. The viewing and interface tools 21 in turn generate upon the output device 16 waveform versions of variable values at the simulation-time values specified in each waveform value list. The viewing and interface tools 21 additionally generate a set of simulation-time markers upon the output device 16 according to the variable identifiers and simulation-time values specified in the simulation-time marker list, such that the output device displays variable waveform histories and simulation-time markers in a manner analogous to that shown in FIG. 8A.

In the preferred embodiment, the viewing and interface tools 21 set the presentation format signal to indicate a sequence-time results presentation format in response to 1) a user selection received via the input device 14 during definition of the variable display list; or 2) user selection of a particular simulation-time marker received via the input device 14 during the display of simulation results in the simulation-time format described above. The presentation of simulation results according to a sequence-time format provides an expanded level of detail relative to that provided by the simulation-time format.

Figure 8B:
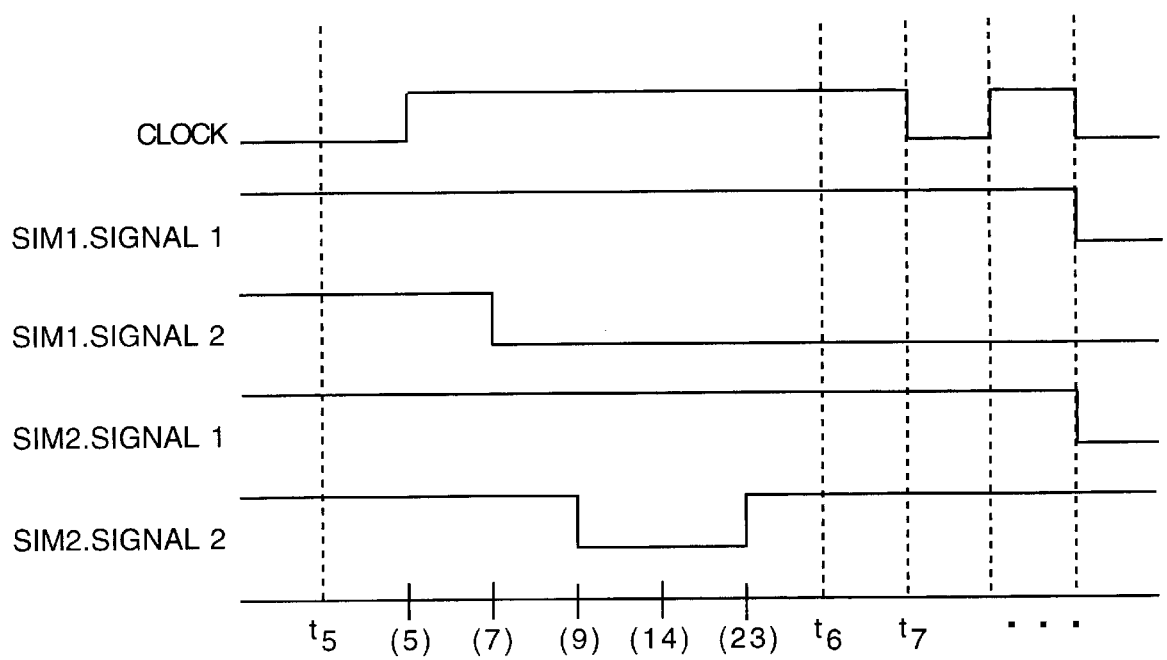
FIG. 8B is a graphical representation of the set of exemplary electronic design simulation results of FIG. 8A expanded according to a preferred sequence-time format.

Referring also now to FIG. 8B, a graphical representation of the set of electronic design simulation results of FIG. 8A expanded according to a preferred sequence-time format is shown. In the preferred sequence-time format, the simulation result histories corresponding to the variable identifiers included within the variable display list are represented as waveform versions of variable (or herein, signal) values at each simulation-time value as well as each recorded internal-time value for which value changes occurred for these variable identifiers. Thus, in the preferred embodiment, the sequence-time presentation format is not a linear with respect to internal-time values. Rather, the internal-time values presented are those for which the selected variable identifiers have corresponding value changes. In FIG. 8B, it is assumed that the presentation format signal has been set to indicate a sequence-time format in response to a user selection of the simulation-time marker shown in FIG. 8A via the input device 14. As shown in FIG. 8B, Sim2.Signal 2 underwent two value transitions during the execution of simulation code associated with simulation-time value t5, namely, at internal-time values 9 and 23. As can be seen from FIG. 8B, via the sequence-time format, the present invention advantageously shows interrelationships between the variable value transitions that occurred within the context of an individual simulation-time value. Those skilled in the art will recognize that prior art systems and methods for processing and/or presenting simulation results do not provide a means for indicating 1) simulation-time values for which multiple assignments to a single variable had occurred; or 2) a sequence of variable value transitions within the context of any single simulation-time value, where the variable value transition sequence corresponds to simulation code statement execution-order. Rather, in the prior art, a long and complex debugging procedure is typically required to determine relationships between variable value transitions generated during the execution of simulation code associated with any particular simulation-time value. The present invention advantageously makes simulation result interpretation and simulation code debugging a much more efficient process.

The presentation format signal preferably indicates whether the sequence-time format is to be applied across multiple simulation-time values or within the context of a particular simulation-time value. In response to user selection of the sequence-time format during variable display list creation, the viewing and interface tools 21 preferably define the presentation format signal to specify the sequence-time format is applicable across all simulation-time values. In response to user selection of a particular simulation-time marker, the viewing and interface tools 21 define the presentation format signal to specify the sequence-time format is applicable within the context of the particular simulation-time value associated with the selected simulation-time marker. In the preferred embodiment, the viewing and interface tools 21 transfer the presentation format signal to the results data server 36 1) upon receipt of the retrieval completion signal; or 2) in response to user-selection of a simulation-time marker.

When the presentation format signal indicates that a sequence-time format is required, the results data server 36 determines the range of simulation-time values across for which the sequence-time format is applicable. Next, the results data server 36 generates for each variable identifier within the variable display list a corresponding waveform value list that includes each applicable simulation-time value as well as each internal-time value for the variable identifier for which a value change had occurred.

In the generation of the waveform value list corresponding to a sequence-time presentation format, the results data server 36 selects a first variable identifier within the variable display list. Next, the results data server 36 selects a first time translation table 170 associated with the selected variable identifier. The results data server 36 then examines the time translation table 170 to locate a starting simulation-time value according to the presentation format signal, and retrieves a corresponding starting internal-time value. The results data server 36 subsequently determines an ending simulation-time value based upon the presentation format signal, and examines either the selected time translation table 170 or a next time translation table 170 associated with the selected variable identifier to determine a final internal-time value.

The results data server 36 next selects the variable history table 180 (or the variable history list 140 retrieved by the history file manager 32, as appropriate) associated with the time translation table 170 from which the starting internal-time value was retrieved. The results data server 36 retrieves the variable value associated with the starting internal-time value, and adds the starting simulation-time value and the retrieved variable value to the selected variable identifier's waveform value list. The results data server 36 then selects a next entry within the variable history table 180. In the event that a variable value change has occurred relative to the most-recently stored entry in the waveform value list, the results data server 36 adds the selected internal-time value/ variable value pair to the waveform value list.

The results data server 36 subsequently determines whether the most-recently selected internal-time value corresponds to the final internal-time value. If so, waveform value list generation is complete for the selected variable identifier. Otherwise, the results data server 36 selects a next entry within the variable history table 180, and determines whether the selected entry corresponds to 1) a simulation-time value change by examining the associated time translation table 170; or 2) a variable value change relative to the most-recently stored variable value in the waveform value list. If a simulation-time value change has occurred, the results data server 36 adds the changed simulation-time value and the corresponding variable value to the waveform value list. If no simulation-time value change has occurred, but a variable value change has occurred, the results data server 36 adds the selected internal-time value/variable value pair to the waveform value list. If neither the simulation-time value nor the variable value have changed, the results data server 36 selects a next entry for consideration within the variable history table 180.

The results data server 36 preferably performs operations analogous to those described above until the selected variable identifier's waveform value list includes each simulation-time value/variable value pair as well as each internal-time value/variable value pair for which a variable value change had occurred between the execution of simulation code associated with the starting simulation-time value and the final simulation-time value, inclusive. In the preferred embodiment, the above operations are repeated to generate a waveform value list for each variable identifier within the variable display list.

Once each waveform value list has been generated, the results data server 36 transfers the waveform value lists to the viewing and interface tools 21. The viewing and interface tools 21 in response determine the simulation-time values across which the sequence-time format is applicable; sort the contents of the set of waveform value lists relative to the variable value changes and internal-time values stored therein; and generate upon the output device 16 waveform versions of variable values at the simulation-time and internal-time values specified in each waveform value list, such that the output device displays variable waveform histories according to both simulation-time and internal-time values in a manner analogous to that shown in FIG. 8B.

In the preferred embodiment, the viewing and interface tools 21 selectively set the presentation format signal to indicate that the simulation-time format is required after the simulation results have been presented in the sequence-time format, in response to a user-selection via the input device 14. In the present invention, when the presentation format signal changes, the viewing and interface tools 21 issue the presentation format signal to the results data server 36, which generates waveform value lists accordingly in the manner described above.

Figure 9A:
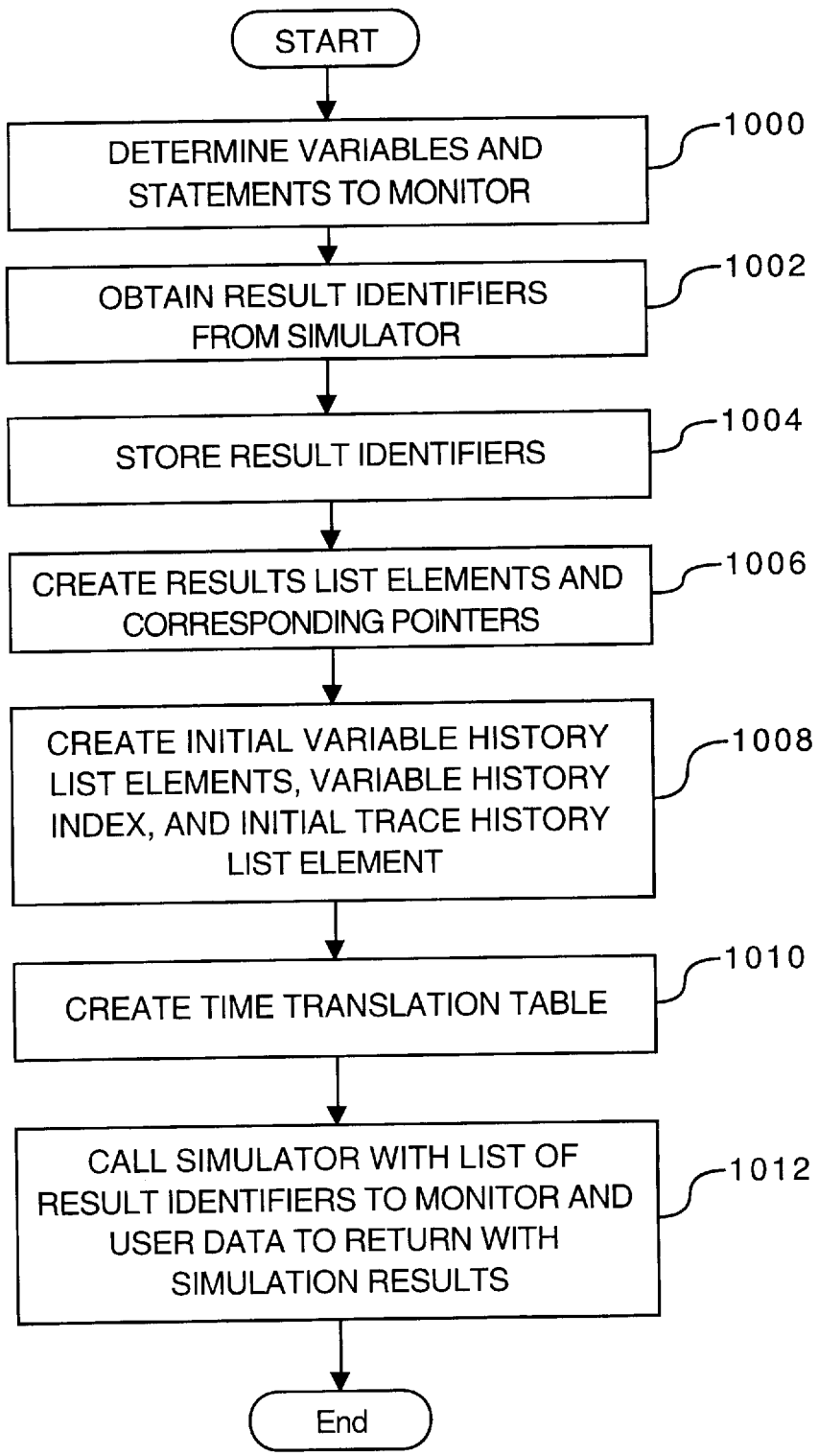
FIG. 9A is a flowchart of a preferred method for initiating execution-sequenced processing of electronic design simulation results.

Referring now to FIG. 9A, a flowchart of a preferred method for initiating execution-sequenced processing of electronic design simulation results is shown. The preferred method begins in step 1000 with the viewing and interface tools 21 determining the set of variables and statements to monitor in response to user-selection via the input device 14, and transferring the variables and statements to be monitored to the simulator interface unit 30. Next, in step 1002, the simulator interface unit 30 obtains the corresponding result and statement identifiers from the simulator 22 in the manner previously described. The simulator interface unit 30 then stores these result and statement identifiers in step 1004.

Following step 1004, the simulator interface unit 30 creates a results list element 102 corresponding to each result identifier and statement identifier, and also creates a pointer to each results list element 102 in step 1006, in the manner described above. The simulator interface unit 30 also creates an initial variable history list element 142, a variable history index 130, and an initial trace history list element 152 in step 1008. After step 1008, the simulator interface unit 30 creates a time translation table 170 in step 1010, and then in step 1012 calls the simulator 22 with a list of statement identifiers and variable identifiers, plus the user-data definitions as described above, thereby requesting initiation of a simulation. Following step 1012, the preferred method ends.

Figure 9B:
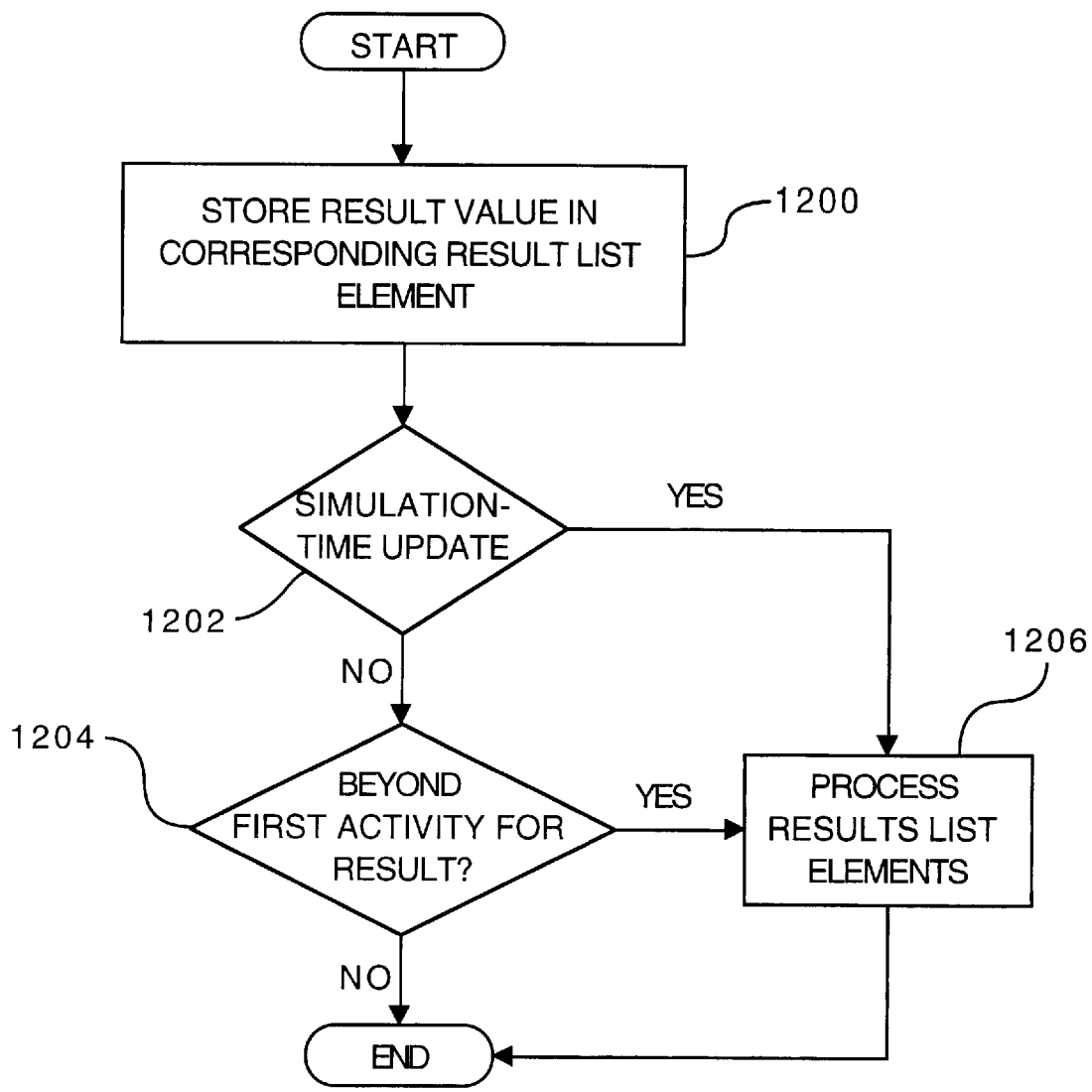
FIG. 9B is a flowchart of a preferred method for updating simulation result histories.

Referring now to FIG. 9B, a flowchart of a preferred method for updating simulation result histories is shown. The preferred method begins in step 1200 with the simulator interface unit 30 storing a result value in its corresponding results list element 102. Step 1200 is preferably performed in the manner described above, in response to the simulator interface unit's receipt of a message from the simulator 22. Following step 1200, the simulator interface unit 30 determines whether a simulation-time update has occurred. If so, the history file manager 32 processes results list elements 102 in step 1206, in the manner described above as well as below with reference to FIGS. 10A and 10B. If no simulation-time update has occurred, the simulator interface unit 30 determines whether the simulation result received is the second or later result activity for its corresponding result identifier, within the context of the current simulation-time value. Preferably, the simulator determines a level of result activity by examining a corresponding result flag, in the manner described above. If the simulation result received is the second or later result activity for its corresponding result identifier, the preferred method proceeds to step 1206. Otherwise, the preferred method ends.

Figure 10A:
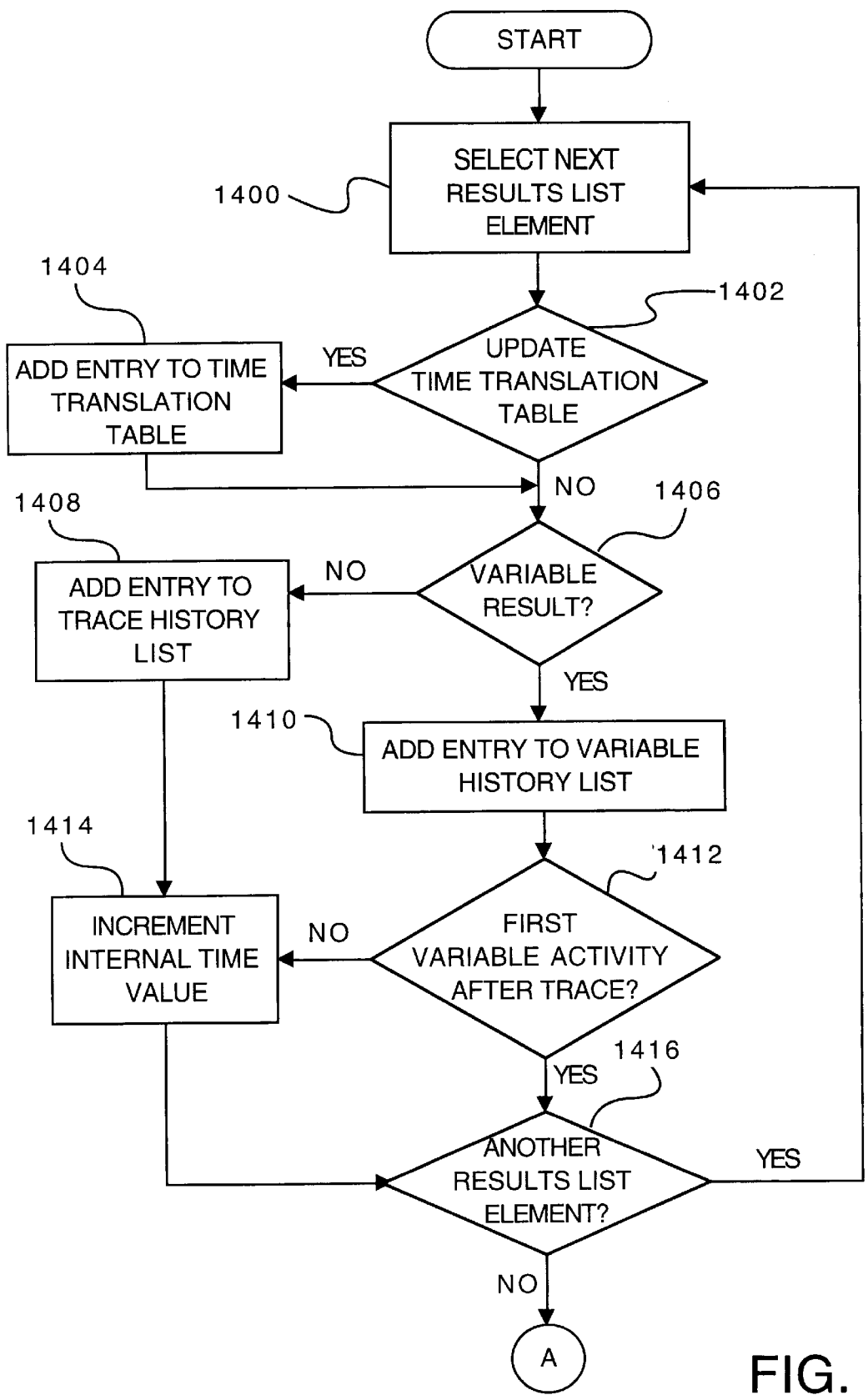
FIGS. 10A and 10B are a flowchart of a preferred method for processing results list elements.
Figure 10B:
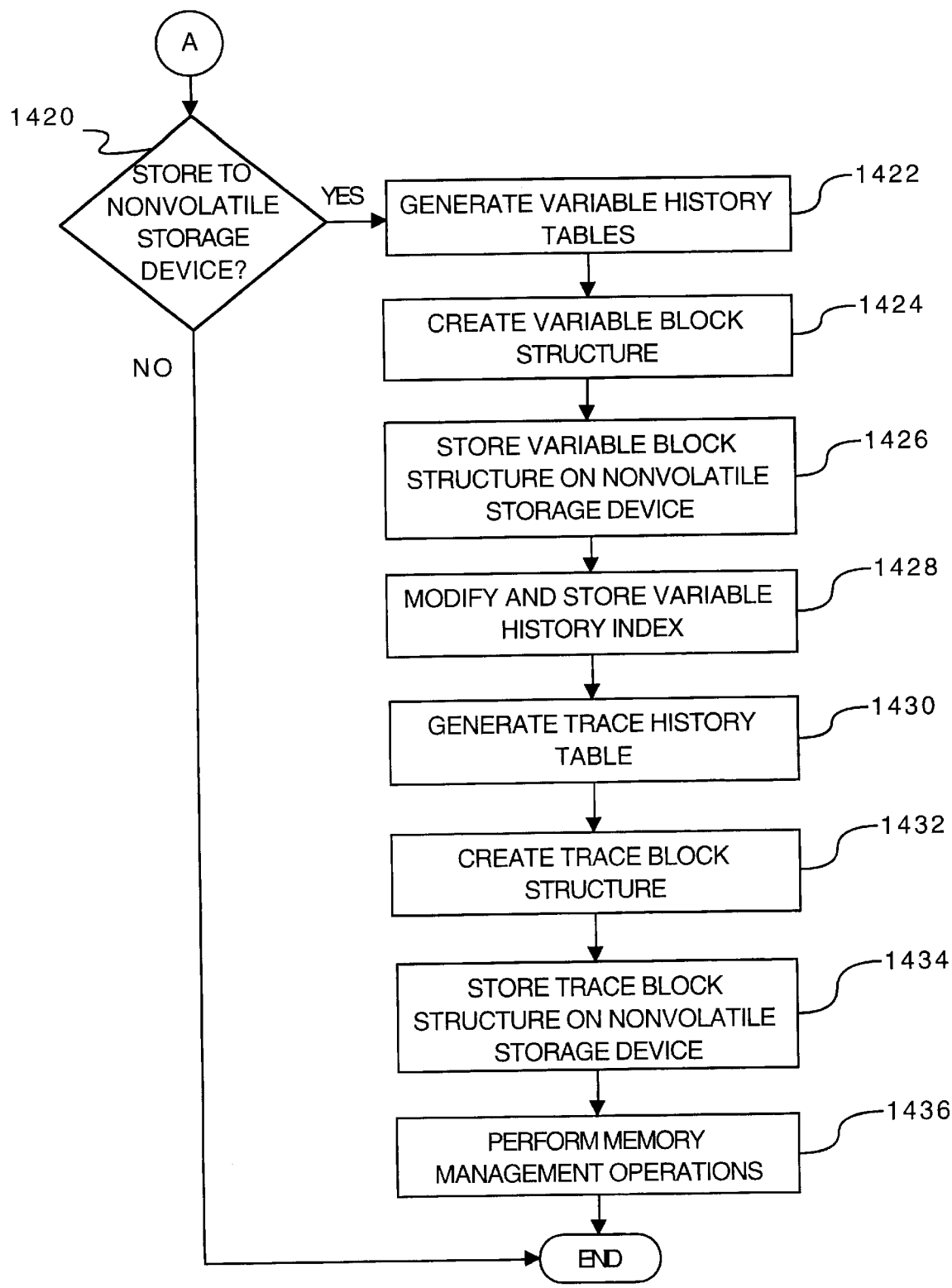

Referring now to FIGS. 10A and 10B, a flowchart of a preferred method for processing results list elements (step 1206 of FIG. 9B) is shown. The preferred method begins in step 1400 with the history file manager 32 selecting a next results list element 102, and subsequently determining whether the time translation table 170 is to be updated in step 1402. Preferably, the history file manager 32 determines that the time translation table 170 requires updating when the current simulation-time value is different from the most-recently stored time translation table entry, as previously described.

In the event that the time translation table 170 requires updating, the history file manager 32 stores the current simulation-time value and the current internal-time value in the time translation table 170 in step 1404. After step 1404, or in the event that the time translation table 170 did not require updating, the history file manager 32 determines whether the selected results list element 102 corresponds to a variable result in step 1406. If not, the history file manager 32 adds an entry to the trace history list 150 in step 1408. Following step 1408, the history file manager 32 updates the internal time value in step 1414.

If in step 1406 the selected results list element 102 corresponds to a variable result, the history file manager 32 adds an entry to the variable history list 140 associated with the selected results list element 102 in step 1410. The history file manager 32 next determines in step 1412 whether the variable result is the first variable activity following a trace result in step 1412. If not, the preferred method proceeds to step 1414 to update the internal time value.

Following step 1414, or after step 1412 in the event that the selected results list element 102 corresponds to the first variable activity following a trace result, the history file manager 1416 determines in step 1416 if another results list element 102 requires consideration. If so, the preferred method returns to step 1400.

After each results list element 102 has been considered, the history file manager 32 determines whether processed results are to be stored upon the nonvolatile storage device 18 in step 1420. Preferably, processed results are to be stored upon the nonvolatile storage device when the amount of memory 20 required to store the set of result history lists 140, the time translation table 170, and the trace history list 150 has reached a predetermined limit, as described above. In the event that this predetermined limit has not been reached, the preferred method ends.

If processed results are to be stored upon the nonvolatile storage device 18, the history file manager 32 generates a variable history table 180 corresponding to each variable history list 140 in step 1422. Next, in step 1424, the history file manager 32 creates a variable block structure 200 in the manner previously described. The history file manager 32 then stores the variable block structure upon the nonvolatile storage device 18 in step 1426. The history file manager 32 subsequently modifies and stores the variable history index 130 stored within this variable block structure 200, such that each reference to a variable history list 140 is replaced with the address at which the corresponding variable history table 180 is stored upon the nonvolatile storage device 18.

The history file manager 32 next generates a trace history table 190 in step 1430, and then in step 1432 generates a trace block structure 220, preferably in the manner previously described. Following step 1432, the history file manager 32 stores the trace block structure 220 upon the nonvolatile storage device 18 in step 1434. The history file manager 32 then performs memory management operations in step 1436, deallocating the memory occupied by 1) the time translation table 170; 2) each variable history table 180; 3) the trace history table 190; 4) all but the first element of each variable history list 140; and 5) all but the first element of the trace history list 150. The history file manager 32 additionally allocates a portion of the memory 20 for storing a new time translation table 170. Following step 1436, the preferred method ends.

Figure 11A:
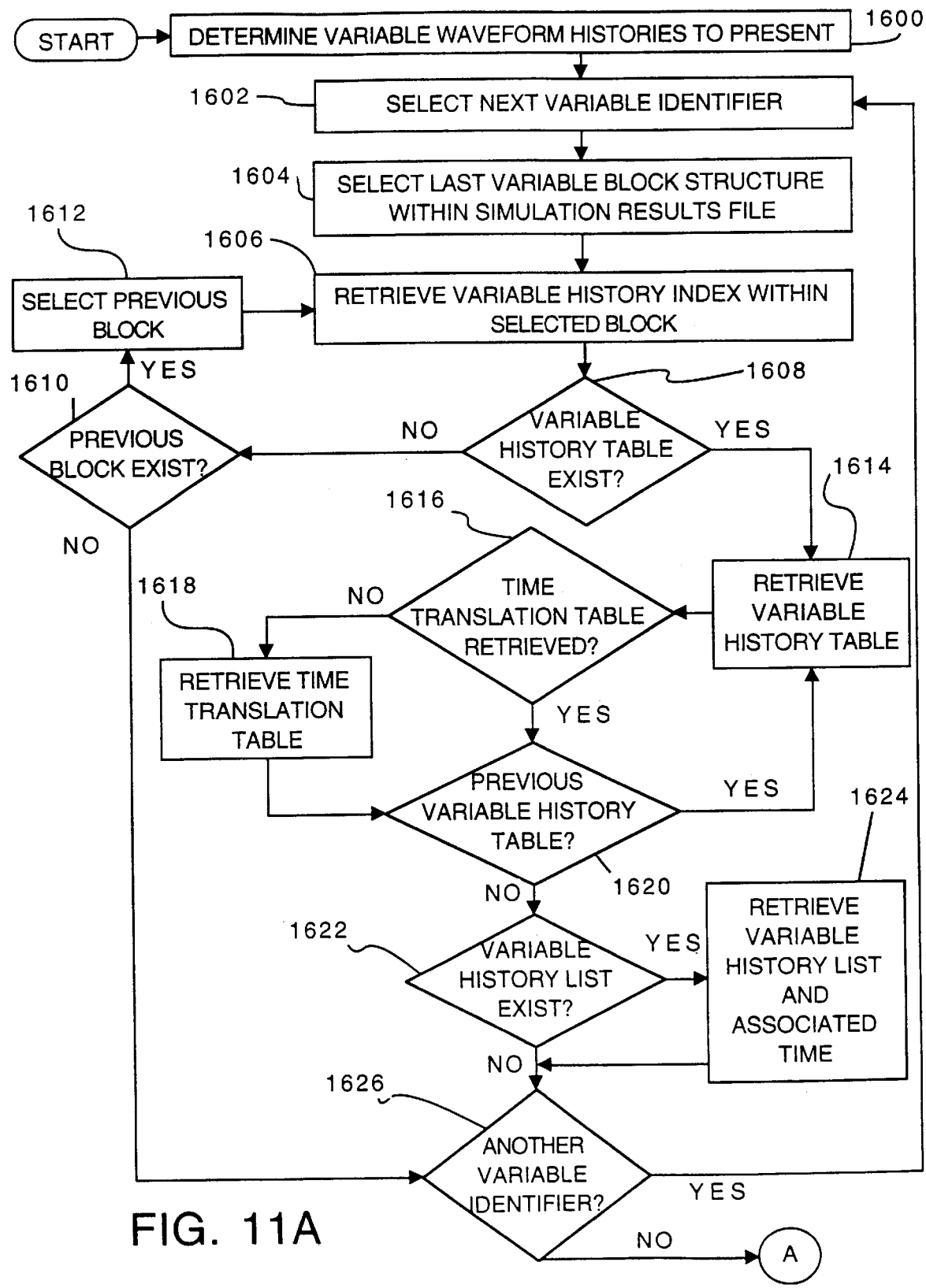
FIGS. 11A and 11B are a flowchart of a preferred method for presenting simulation results in accordance with a simulation-time format or a sequence-time format.
Figure 11B:
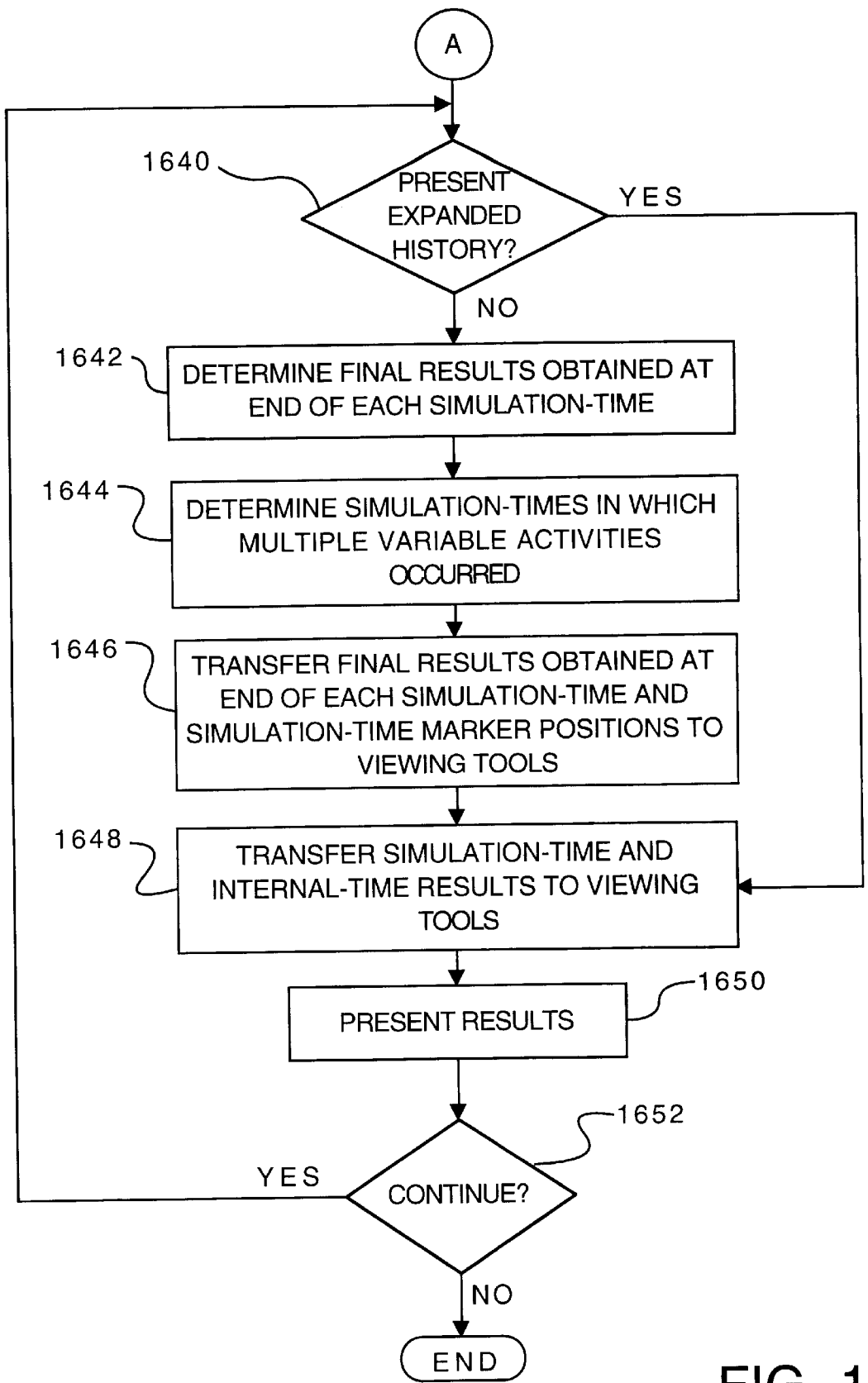

Referring now to FIGS. 11A and 11B, a flowchart of a preferred method for selectively presenting simulation results in accordance a simulation-time format or a sequence-time format is shown. The preferred method begins in step 1600 with the viewing and interface tools 21 determining a set of variable waveform histories to present via the generation of the variable display list. The history file manager 32 then selects a first or next variable identifier for consideration in step 1602. The history file manager 32 selects a last variable block structure 200 within the corresponding simulation result file in step 1604, and retrieves the variable history index stored therein in step 1606. Next, the history file manager 32 determines whether a variable history table 180 exists within the selected variable block structure 200 for the selected variable identifier in step 1608. If not, the history file manager 32 determines in step 1610 whether a previous variable block structure 200 exists within the simulation results file. If so, the history file manager 32 selects a previous variable block structure 200 for consideration in step 1612, after which the preferred method returns to step 1606. If no previous variable block structure 200 exists, the preferred method proceeds to step 1626, which is described in detail below.

In the event that a variable history table 180 is found to exist in step 1608, the history file manager 32 retrieves the variable history table 180 in step 1614. Via steps 1616 and 1618, the history file manager 32 selectively retrieves the associated time translation table 170 in the event that it had not been retrieved. After step 1616 or step 1618, the history file manager 32 determines in step 1620 whether the most-recently retrieved variable history table 180 contains a reference to a previous variable history table 180 in step 1620. If so, the preferred method returns to step 1614.

In the event that a reference to a previous variable history table 180 does not exist in step 1620, the history file manager 32 determines in step 1622 whether a variable history list 140 corresponding to the selected variable identifier exists. If so, the history file manager 32 retrieves the variable history list 140 and the most-recently created time translation table 170 in step 1624. Via steps 1614 through 1624, the history file manager 32 retrieves the current simulation result history for the variable identifier currently under consideration.

After step 1624, or after step 1622 in the event that a corresponding variable history list 140 is not present, the history file manager 32 determines whether another variable identifier requires consideration in step 1626. If so, the preferred method returns to step 1602.

After the history file manager 32 has retrieved the simulation result history for each variable identifier within the variable display list, the results data server 36 determines whether simulation results are to be presented according to a simulation-time format, or an expanded sequence-time format in step 1640. If simulation result histories are to be presented according to a simulation-time format, the results data server 36 determines the final simulation results obtained at the end of each simulation time value in step 1642; determines any simulation-time values in which multiple variable assignments occurred in step 1644; and transfers the final simulation results as well as a set of simulation-time marker positions to the viewing and interface tools 21 in step 1646. Steps 1642 through 1646 are preferably performed in the manner previously described.

In the event that simulation result histories are to be presented according to a sequence-time format, the results data server 36 collects and transfers simulation-time value/variable value pairs as well as internal-time value/variable value pairs to the viewing and interface tools 21 in step 1648, in the manner described above.

Following either of steps 1646 or 1648, the viewing and interface tools 21 present the simulation results received from the results data server 36 upon the output device 16 in step 1650. Next, in step 1652, the viewing and interface tools 21 determine whether results presentation is to continue. If so, the preferred method returns to step 1640; otherwise, the preferred method ends.

While the present invention has been described with reference to certain preferred embodiments, those skilled in the art will recognize that various modifications may be provided. For example, variable activity beyond variable changes could be selectively stored during the generation of one or more waveform value lists when result presentation according to a sequence-time format is required. This and other variations upon and modifications to the preferred embodiments are provided for by the present invention, which is limited only by the following claims.

What is claimed is:

1. A computer-implemented method for execution-sequenced processing of electronic design simulation results comprising the steps of:

receiving a set of electronic design simulation results generated by an electronic design simulator, each simulation result comprising a result value that corresponds to a result identifier and a simulation-time value;

generating a first graphical history that indicates a sequence of simulation result value transitions that occurred during the execution of electronic design simulation code associated with a single simulation-time value; and generating a second graphical history that indicates final simulation result values generated from a final iterative execution of a set of simulation code statements.

2. The method of claim 1, further comprising the step of generating a marker upon the second graphical history, the marker indicating whether multiple value assignments associated with a single result identifier had occurred during the execution of simulation code associated with a single simulation-time value.

3. A computer-implemented method for execution-sequenced processing of electronic design simulation results comprising the steps of:

receiving a first electronic design simulation result generated by an electronic design simulator, where the first simulation result comprises a first result value corresponding to a first result identifier and a first simulation-time value;

generating a first internal-time value, which is independent of the first simulation-time value;

storing the first result value, the first simulation-time value, and the first internal-time value;

receiving a second simulation result, where the second simulation result comprises a second result value corresponding to a second result identifier and a second simulation-time value;

generating a second internal-time value, which is independent of the first simulation-time value and the second simulation-time value, that indicates a relative time at which the second simulation result was generated with respect to the first simulation result; and storing the second result value and the second internal-time value.

4. The method of claim 3, wherein the second simulation-time value is equal to the first simulation time value.

5. The method of claim 4, wherein the second result identifier is identical to the first result identifier.

6. The method of claim 3, further comprising the step of generating a graphical history that indicates a sequence of simulation result value transitions that occurred within the context of a single simulation-time value.

7. The method of claim 6, wherein the graphical history corresponds to a sequential order in which a set of simulation code statements had been executed.

8. The method of claim 3, further comprising the step of determining whether multiple assignments corresponding to a single variable identifier had been made during the execution of simulation code associated with a single simulation-time value.

9. The method of claim 3, further comprising the step of generating a marker that indicates when multiple assignments had been made to a single variable during the execution of simulation code associated with a single simulation-time value.

10. The method of claim 3, wherein the first simulation result corresponds to one from a group of a variable, a signal, and an execution of a particular set of simulation-code statements.

11. A means for execution-sequenced processing of electronic design simulation results comprising:

means for receiving a set of electronic design simulation results generated by an electronic design simulator, each simulation result comprising a result value that corresponds to a result identifier and a simulation-time value;

means for generating a first graphical history that indicates a sequence of simulation result value transitions that occurred during the execution of electronic design simulation code associated with a single simulation-time value; and means for generating a second graphical history that indicates final simulation result values generated from a final iterative execution of a set of simulation code statements.

12. The means of claim 11, further comprising means for generating a marker upon the second graphical history, the marker indicating whether multiple value assignments associated with a single result identifier had occurred during the execution of simulation code associated with a single simulation-time value.

13. A means for execution-sequenced processing of electronic design simulation results comprising:

means for receiving a first electronic design simulation result generated by an electronic design simulator, where the first simulation result comprises a first result value corresponding to a first result identifier and a first simulation-time value;

means for generating a first internal-time value, which is independent of the first simulation-time value;

means for storing the first result value, the first simulation-time value, and the first internal-time value;

means for receiving a second simulation result, where the second simulation result comprises a second result value corresponding to a second result identifier and a second simulation-time value;

means for generating a second internal-time value, which is independent of the first simulation-time value and the second simulation-time value, that indicates a relative time at which the second simulation result was generated with respect to the first simulation result; and means for storing the second result value and the second internal-time value.

14. The means of claim 13, further comprising means for generating a graphical history that indicates a sequence of simulation result value transitions that occurred within the context of a single simulation-time value.

15. The means of claim 13, further comprising means for determining whether multiple assignments corresponding to a single variable identifier had been made during the execution of simulation code associated with a single simulation-time value.

16. A computer-useable medium having computer-readable program code embodied therein for causing a computer to perform the steps of:

receiving a set of electronic design simulation results generated by an electronic design simulator, each simulation result comprising a result value that corresponds to a result identifier and a simulation-time value;

generating a first graphical history that indicates a sequence of simulation result value transitions that occurred during the execution of electronic design simulation code associated with a single simulation-time value; and generating a second graphical history that indicates final simulation result values generated from a final iterative execution of a set of simulation code statements.

17. The computer-useable medium of claim 16, further comprising program code embodied therein for causing a computer to perform the step of generating a marker upon the second graphical history, the marker indicating whether multiple value assignments associated with a single result identifier had occurred during the execution of simulation code associated with a single simulation-time value.

18. A computer-useable medium having computer-readable program code embodied therein for causing a computer to perform the steps of:

receiving a first electronic design simulation result generated by an electronic design simulator, where the first simulation result comprises a first result value corresponding to a first result identifier and a first simulation-time value;

generating a first internal-time value, which is independent of the first simulation-time value;

storing the first result value, the first simulation-time value, and the first internal-time value;

receiving a second simulation result, where the second simulation result comprises a second result value corresponding to a second result identifier and a second simulation-time value;

generating a second internal-time value, which is independent of the first simulation-time value and the second simulation-time value, that indicates a relative time at which the second simulation result was generated with respect to the first simulation result; and storing the second result value and the second internal-time value.

19. A system for execution-sequenced processing of electronic design simulation results comprising:

a memory for storing data and commands, the memory including an electronic design simulator that generates a set of electronic design simulation results, each simulation result comprising a result value that corresponds to a result identifier and a simulation time value;

a simulation interface unit that monitors simulation result value transitions that occur during the execution of electronic design simulation code associated with each simulation-time value;

a results data server, for generating a graphical history that indicates a sequence of simulation result value transitions that occurred during the execution of simulation code associated with a single simulation-time value; and an internal-time counter, for maintaining an internal time value that indicates a relative time at which a simulation result was generated with respect to a most-recently generated simulation result;and a processing unit, for selectively executing commands stored in the memory, the processing unit coupled to receive commands from and exchange data with the memory.

20. The system of claim 19, wherein the memory further comprises a history file manager, for generating and storing a simulation result history file that associates unique simulation result values with internal-time values and simulation-time values.

21. A computer-implemented method for execution-sequenced processing of electronic design simulation results comprising the steps of:

receiving a set of simulation results generated by a simulator, each simulation result comprising a result value that corresponds to a result identifier and a simulation-time value;

generating a first graphical history that indicates a sequence of simulation result value transitions that occurred during the execution of simulation code associated with a single simulation-time value; and generating a second graphical history that indicates final simulation result values generated from a final iterative execution of a set of simulation code statements.

22. The method of claim 21, further comprising the step of generating a marker upon the second graphical history, the marker indicating whether multiple value assignments associated with a single result identifier had occurred during the execution of simulation code associated with a single simulation-time value.

23. A computer-implemented method for execution-sequenced processing of electronic design simulation results comprising the steps of:

receiving a first simulation result generated by a simulator, where the first simulation result comprises a first result value corresponding to a first result identifier and a first simulation-time value;

generating a first internal-time value;

storing the first result value, the first simulation-time value, and the first internal-time value;

receiving a second simulation result, where the second simulation result comprises a second result value corresponding to a second result identifier and a second simulation-time value;

generating a second internal-time value that indicates a relative time at which the second simulation result was generated with respect to the first simulation result;

storing the second result value and the second internal-time value; and generating a marker that indicates when multiple assignments had been made to a single variable during the execution of simulation code associated with a single simulation-time value.

24. A means for execution-sequenced processing of electronic design simulation results comprising:

means for receiving a set of simulation results generated by a simulator, each simulation result comprising a result value that corresponds to a result identifier and a simulation-time value;

means for generating a first graphical history that indicates a sequence of simulation result value transitions that occurred during the execution of simulation code associated with a single simulation-time value; and means for generating a second graphical history that indicates final simulation result values generated from a final iterative execution of a set of simulation code statements.

25. The means of claim 24, further comprising means for generating a marker upon the second graphical history, the marker indicating whether multiple value assignments associated with a single result identifier had occurred during the execution of simulation code associated with a single simulation-time value.

26. A computer-useable medium having computer-readable program code embodied therein for causing a computer to perform the steps of:

receiving a set of simulation results generated by a simulator, each simulation result comprising a result value that corresponds to a result identifier and a simulation-time value;

generating a first graphical history that indicates a sequence of simulation result value transitions that occurred during the execution of simulation code associated with a single simulation-time value; and generating a second graphical history that indicates final simulation result values generated from a final iterative execution of a set of simulation code statements.

27. The computer-useable medium of claim 26, further comprising program code embodied therein for causing a computer to perform the step of generating a marker upon the second graphical history, the marker indicating whether multiple value assignments associated with a single result identifier had occurred during the execution of simulation code associated with a single simulation-time value.

28. A system for execution-sequenced processing of electronic design simulation results comprising:

a memory for storing data and commands, the memory comprising a simulator that generates a set of simulation results, each simulation result comprising a result value that corresponds to a result identifier and a simulation time value, a simulation interface unit that monitors simulation result value transitions that occur during the execution of simulation code associated with each simulation-time value, and an internal-time counter, for maintaining an internal time value that indicates a relative time at which a simulation result was generated with respect to a most-recently generated simulation result; and a processing unit, for selectively executing commands stored in the memory, the processing unit coupled to receive commands from and exchange data with the memory.

29. The system of claim 28, wherein the memory further comprises a history file manager, for generating and storing a simulation result history file that associates unique simulation result values with internal-time values and simulation-time values.

* * * * *